United States Patent [19]

Imai et al.

[11] Patent Number: 5,716,494
[45] Date of Patent: Feb. 10, 1998

[54] DRY ETCHING METHOD, CHEMICAL VAPOR DEPOSITION METHOD, AND APPARATUS FOR PROCESSING SEMICONDUCTOR SUBSTRATE

[75] Inventors: Shinichi Imai; Tokuhiko Tamaki, both of Osaka, Japan

[73] Assignee: Matsushita Electric Industrial Co., Ltd., Osaka, Japan

[21] Appl. No.: 365,963

[22] Filed: Dec. 29, 1994

Related U.S. Application Data

[63] Continuation-in-part of Ser. No. 79,529, Jun. 22, 1993, abandoned.

[30] Foreign Application Priority Data

Jun. 27, 1994 [JP] Japan .................. 6-144730

[51] Int. Cl.$^6$ .................................................. H01L 21/00
[52] U.S. Cl. ........................... 156/643.1; 156/646.1
[58] Field of Search ......................... 156/643.1, 646.1, 156/667.1

[56] References Cited

U.S. PATENT DOCUMENTS

| | | | |
|---|---|---|---|
| 4,314,875 | 2/1982 | Flamm | 156/643.1 |
| 4,529,476 | 7/1985 | Kawamoto . | |
| 4,687,543 | 8/1987 | Bowker . | |
| 4,741,797 | 5/1988 | Chen . | |
| 4,997,778 | 3/1991 | Sim . | |
| 5,076,877 | 12/1991 | Ueda . | |
| 5,078,833 | 1/1992 | Kadomura | 156/646.1 X |
| 5,098,638 | 3/1992 | Sawada . | |
| 5,180,464 | 1/1993 | Tatsumi . | |
| 5,296,095 | 3/1994 | Nabeshima et al. | 216/67 |
| 5,318,668 | 6/1994 | Tamaki et al. | 156/643.1 X |
| 5,376,234 | 12/1994 | Yanagida | 156/643.1 X |
| 5,397,431 | 3/1995 | Kadomura | 156/643.1 |
| 5,401,359 | 3/1995 | Kadomura | 156/643.1 |
| 5,423,941 | 6/1995 | Komura et al. | 156/643.1 |

FOREIGN PATENT DOCUMENTS

| | | |
|---|---|---|
| 60-165724 | 8/1985 | Japan . |
| 2-151031 | 6/1990 | Japan . |

*Primary Examiner*—Thi Dang
*Attorney, Agent, or Firm*—McDermott, Will & Emery

[57] ABSTRACT

In performing plasma etching or plasma CVD, a gas containing an interhalogen compound gas or a $XeF_2$ gas is used as a process gas. Such a process gas generates, in the state of non-plasma and with activation energy lower than a specified level, a volatile material from a deposition species generated in the above etching so as to contribute to the suppression of film formation. For example, the $XeF_2$ gas, a $BrF_3$ gas, a BrCl gas are used in the cases of etching a silicon dioxide film, a silicide film, and a polysilicon film, respectively. On the surface of a substrate is formed a non-volatile protective film so as to improve the profiles of an opening. At the wall surface of a reaction chamber which is barely influenced by the plasma, the deposition species is turned into a volatile material (e.g., $SiF_4$) so as to suppress the deposition of reaction products thereon. If the interhalogen compound gas, $XeF_2$ gas, or the like is added to a main gas for performing CVD, the same effects can be achieved.

14 Claims, 23 Drawing Sheets

5,716,494

DRY ETCHING METHOD, CHEMICAL VAPOR DEPOSITION METHOD, AND APPARATUS FOR PROCESSING SEMICONDUCTOR SUBSTRATE

This application is Continuation-In-Part of application Ser. No. 08/079,529, filed Jun. 22, 1993, now abandoned.

BACKGROUND OF THE INVENTION

The present invention relates to a dry etching method, to a chemical vapor deposition method, and to an apparatus for processing a semiconductor substrate, each using a plasma.

With an increasing demand for more compact electronic devices with higher performance from market, the packing density of various semiconductor devices has been increasing in recent years. The fabrication of these semiconductor devices requires many techniques for forming such elements as transistors on semiconductor substrates and then forming insulating layers and wiring layers thereon in three dimensions. Therefore, techniques for selectively or entirely removing insulating or conductive films are equally important as techniques for depositing these films. These techniques for removing insulating films and the like can be subdivided into wet etching and dry etching: wet etching uses a liquid as the etchant while dry etching uses a gas as the etchant. The two types of techniques are selectively used depending on the material, shape, or other properties of a subject to be etched. At present, dry etching is regarded as essential techniques for producing semiconductor devices.

Among the techniques for isolating individual elements in fabricating a semiconductor device, the LOCOS (Local Oxidation of Silicon) forming process is most commonly used. According to the process, a silicon-dioxide film is first formed on a semiconductor substrate and then the film is further partially grown to provide thicker isolation regions. After that, a silicon-nitride film is formed on the silicon-dioxide film so as to serve as a mask for the silicon-dioxide film except for the isolation regions. The dry etching method for etching the silicon-nitride film in accordance with the above-mentioned LOCOS process will be described below.

FIG. 21 is a view diagrammatically showing a conventional device for etching the silicon-nitride film. In a chamber 10 of the RIE-mode etching device A are provided a pair of electrodes 12a and 12b which are vertically opposed to each other. A silicon substrate X1 is placed on the lower electrode 12b and electrically connected thereto. As the reactive gas for etching, a $CH_2F_2$ gas and a $CF_4$ gas are introduced into the chamber 10 from a $CH_2F_2$ gas supplying device 18 and a $CF_4$ gas supplying device 19 at flow rates of approximately 30 $cm^3$/min and 15 $cm^3$/min, respectively. A radio-frequency voltage of 13.56 MHz is applied from a radio-frequency power supply 13 with the power of 250 W while maintaining the inside pressure at 8 Pa by using a vacuum pump via an exhaust hole 15, so as to produce a plasma by the reactive gas. The resulting plasma is used for etching the silicon-nitride film 1.

FIGS. 22(a) to (e) show the cross sections of the silicon substrate X1 in different steps for forming the isolation regions.

First, as shown in FIG. 22(a), a silicon-dioxide film 2 and the silicon-nitride film 1 are successively deposited on the silicon substrate 3 to the thickness of 10 to 20 nm and to the thickness of 180 to 200 nm, respectively. A photoresist film 5 is then applied to the surface of the silicon-nitride film 1 and patterned, so as to form a mask.

Subsequently, as shown in FIG. 22(b), dry etching is performed by using the photoresist film 5 as a mask so as to selectively remove the silicon-nitride film 1 alone, thus forming an opening 7 which corresponds to the isolation region. Thereafter, as shown in FIG. 22(c), the photoresist film 5 is removed by ashing.

The silicon-nitride film 1, thus patterned in the foregoing steps will be used as a mask in the following process for selectively oxidizing the silicon-dioxide film 2.

By using the patterned silicon-nitride film 1 as the mask, as shown in FIG. 22 (d), the region of the silicon-dioxide film 2 corresponding to the opening 7 of the mask is selectively oxidized for further growth, resulting in LOCOS 4 serving as the isolation region.

After that, the silicon-nitride film 1 alone is removed by wet etching by using an etchant containing a heated phosphoric acid as the main component, as shown in FIG. 22(e).

Thus, the isolation regions are obtained by partially thickening the silicon-dioxide film 2 formed on the silicon substrate 3.

Another example using dry etching is the process for forming contact holes. In the case where multi-layered wiring is provided on a semiconductor substrate, holes are formed by selectively etching an inter-layer insulating film so as to contact wires with the active region of the substrate. When the inter-layer insulating film is etched away for forming the contact holes for wiring, the substrate underneath is exposed and is also subjected to a certain degree of etching effect, resulting in the generation of a damaged layer. Since the damaged layer adversely affects the functions of the semiconductor device, it is essential to provide an extra step for removing the damaged layer subsequently to the etching. The conventional dry etching method for forming the contact holes will be described below.

FIG. 23 is a view diagrammatically showing the conventional apparatus for etching a silicon-dioxide film to form the contact holes. An embodiment using an etching apparatus A in the three-electrode mode is described here. In the chamber 10 of the etching apparatus A are provided three electrodes 12a to 12c. On the lower electrode 12b is placed a silicon substrate X2 (its detailed drawing is omitted), in which a photoresist film was previously patterned on a silicon-dioxide film deposited on a switching transistor. As the etchant gas, a $CHF_3$ gas and a $CF_4$ gas are introduced into the chamber 10 from a $CHF_3$ gas supplying device 16 and a $CF_4$ gas supplying device 19, respectively. While the etchant gas is introduced, the pressure in the chamber 10 is maintained at 26.8 Pa by a vacuum pump via an exhaust hole 15. A radio-frequency voltage of 100 kHz is applied from a radio-frequency power supply 13a to the lower voltage 12b with the power 100 W, while a voltage of 13.56 MHz is applied from the radio-frequency power supply 13b to the electrode 12c with the power of 200 W.

FIG. 24 shows the sequence of conventional dry-etching steps for forming the contact holes. First, in the step SR11, a $CHF_3$ gas and a $CF_4$ gas are introduced into the chamber at the flow rates of 27 $cm^3$/min and 9 $cm^3$/min, respectively, to serve as the etchant gas. A radio-frequency voltage is then applied in the step SR12, so that a plasma is generated in the step SR13. After the silicon-dioxide film on the silicon substrate X2 is selectively removed by etching to form the contact holes in the step SR14, the radio-frequency power supply 13 is switched off to complete the etching on the silicon substrate X2 in the step SR15.

Thereafter, in the step SR16, a $CF_4$ gas and a $CHF_3$ gas are introduced into the chamber 10 at the flow rates of 20 $cm^3$/min and 40 $cm^3$/min, respectively, in order to remove the damaged layer generated by the etching. In the step SR17, the radio-frequency power supply 13 is switched on to apply the radio-frequency voltage, thereby producing a plasma in the gas in the step SR18. The damaged layer is etched by the resulting plasma in the step SR19, and the etching is completed in the step SR20.

With the increasing packing density of semiconductor devices, the spacing between the isolation regions becomes narrower, so that it is important to increase the accuracy with which the silicon-nitride film is processed by dry etching in the above-mentioned LOCOS forming process. The increased processing accuracy is also required by the etching for forming the contact holes.

Plasma etching, which is one of the dry-etching methods, generates F radicals in a plasma by introducing a mixture gas of a $CF_4$, $CHF_3$, $CH_2F_2$ or like gas and a $H_2$, $O_2$ or like gas. The reaction of the F radicals with silicon or tungsten silicide generates volatile materials such as SiF or $WF_6$, which executes the patterning of films composed of silicon-containing materials such as silicon, silicon dioxide, and silicon nitride, and of films composed of Al, Mo, W, or the like.

In the plasma etching, ions and neutral radicals are generated. The ions are accelerated toward the silicon substrate so that the energy resulting from the collision between the ions and the materials on substrate removes the silicon-nitride film 1 and the like, thus performing anisotropic etching. On the other hand, the radicals are not accelerated by the application of an electric field or the like because of its neutrality, thus performing isotropic etching. However, the isotropic etching by the radicals is controlled because when a carbon-containing gas is used for the etching, polymers are formed by plasma polymerization, resulting in the deposition of a polymer film on the etched portion, especially on the side walls of the opening. Consequently, the undercutting of the sidewalls underneath the mask is not caused by the etching, which makes plasma etching advantageous.

However, the conventional dry etching method which is practiced in forming the foregoing LOCOS 4 by selectively removing the silicon-nitride film 1 and the like is disadvantageous in that after the silicon-nitride film 1 is etched, the side walls of the opening 7 are tapered at an angle of approximately 60°, as shown in FIGS. 22(b) to 22(c). As a result, the pattern shift of the silicon-nitride film 1 becomes as much as 0.1 µm. In general, the width of the silicon-dioxide film has been reduced as the higher intensity has been attained in semiconductor devices. However, the width of the LOCOS is further reduced due to the pattern shift, so that the sufficient isolation effect may not be obtained. Moreover, polymers are formed in the generation of a plasma in the mixture gas of $CH_2F_2$ and $CHF_4$ and is deposited as a film on the substrate and the inner wall of the chamber, resulting in dust, which may exert undesirable influences on the semiconductor device being fabricated, and on its yield. Moreover chamber maintenance of etcher is often necessary. Developing the etcher with maintenance free is the dream of many engineers who are engaged in dry etching.

The dry etching for forming the contact holes is also disadvantageous because of the above-mentioned pattern shift and the dust resulting from the polymer. Furthermore, if the dry etching is performed in accordance with the step SR11 to SR15 of FIG. 24 shown above, the underlying silicon substrate 3 is simultaneously etched with the silicon-dioxide film 2, resulting in the generation of a damaged layer. To remove the damaged layer, it was necessary to provide extra steps (the steps SR16 to SR19 of FIG. 24) in which a reactive gas is introduced under another condition and a radio-frequency voltage is applied again to etch the damaged layer.

There has also been well known a chemical vapor deposition (CVD) method whereby an insulating film such as a silicon dioxide film or a silicon nitride film and a conductive film such as a polysilicon film or a silicide film are deposited on a semiconductor substrate by turning the process gas into a plasma for reaction. However, the process of chemical vapor deposition is also disadvantageous in that a deposition species generated by the polymerization of radicals in the state of plasma causes dust, similarly to the process of dry etching.

Moreover, the deposition species generated by the radicals in the state of plasma in such a chamber as described above is scattered not only in the space between the upper and lower electrodes in which the plasma is generated, but also on the inner surface of the chamber and on an exhaust pipe, so that a polymer is grown from the deposition species, resulting in dust falling onto the inner surface of the chamber and the like. Consequently, it is frequently required to stop the process and clean the inside of the chamber so as to remove the dust and polymer films. Due to the cleaning procedure, the time period during which the chamber can be used continuously is extremely shortened, which substantially stagnates the whole process of manufacturing a semiconductor apparatus.

SUMMARY OF THE INVENTION

A first object of the present invention is to suppress, in a dry etching method, the formation of a polymer films from a deposition species which results from the polymerization of radicals in the state of plasma, thereby suppressing the generation of dust and the size shift.

A second object of the present invention is to suppress the generation of dust in a chemical vapor deposition method.

A third object of the present invention is to suppress the deposition of dust on the inner surface of the chamber in which dry etching or chemical vapor deposition is performed, thereby saving the labor of cleaning the dust off the inner surface of the chamber.

To attain the above first object, the dry etching method of the present invention comprises the steps of: disposing in a reaction chamber a semiconductor substrate formed with a film; introducing into the reaction chamber a process gas for exerting, in the state of plasma, the effects of etching the above film and depositing reaction products on the wall surface of an opening formed by etching, while generating, in the state of non-plasma and with activation energy lower than a specified level, a volatile material from a deposition species generated in the above etching so as to contribute to the suppression of film formation; and removing at least a part of the above film by turning the process gas into a plasma in the vicinity of the semiconductor substrate in the above reaction chamber.

In performing dry etching by the above method, reaction products are deposited in the inner surfaces of openings which are formed in the semiconductor substrate by etching, so that the proceeding of etching in the lateral direction is prevented, resulting in anisotropic etching. Due to anisotropic etching thus performed, the profiles of the openings are improved. On the other hand, a volatile material is generated through the reaction between the process gas and the deposition species at the wall surface of the reaction chamber, which is barely influenced by the plasma, so that the deposition of the reaction products on the wall surface of the reaction chamber is suppressed.

In the above dry etching method, the above process gas may contain at least an interhalogen compound gas such as a $ClF_3$ gas, a $BrCl$ gas, or $BrF_3$ gas. In this case, since the material resulting from the reaction between an interhalogen compound and a main gas in the state of non-plasma is highly volatile, the effect of suppressing the deposition of the reaction products on the wall surface of the reaction chamber is significant.

In the case of removing a silicon oxide, a gas containing an interhalogen compound gas and a fluoro-carbon gas may be used as the process gas. In this case, F and $CF_x$ radicals resulting from the decomposition of interhalogen compound gas and the fluoro-carbon gas combine with each other, generating volatile $CF_4$, so that the deposition of the reaction products on the wall surface of the reaction chamber is suppressed.

By way of example, a $ClF_3$ gas is used as the above interhalogen compound gas and at least one of a $CHF_3$ gas, a $CH_2F_2$ gas, a $C_3F_6$ gas, and a $C_4F_8$ gas is used as the above fluoro-carbon gas. Moreover, it is also possible to mix an inert gas, in addition to the fluoro-carbon gas and the interhalogen compound gas, into the above process gas.

The following are proper combinations of a film to be removed by the above dry etching method and a process gas.

In the case of removing a polysilicon film, a process gas containing at least a BrCl gas can be used. With the combination, a non-volatile material such as $SiO_xBr_y$ is generated at the semiconductor substrate, which is deposited on the inner surfaces of the openings, thereby performing anisotropic etching. On the other hand, a volatile material such as $SiCl_4$ is generated through the chlorination of the deposition species such as $SiBr_x$ at the wall surface of the reaction chamber which is barely influenced by the plasma, so that the deposition of the reaction products on the wall surface of the reaction chamber is suppressed.

In the case of removing a metal film containing Al as its main component, the process gas containing the BrCl gas can be used. In forming an Al interconnection by etching with the combination, a non-volatile material (e.g., $AlBr_x$) is generated in the presence of the plasma at the surface of the semiconductor substrate, which protects the side walls of the openings. On the other hand, a volatile material such as $AlCl_x$ is generated through the chlorination of Al by the BrCl gas on the inner surface of the reaction chamber which is barely influenced by the plasma, thereby suppressing the deposition of the reaction products on the wall surface of the reaction chamber.

In the case of removing the silicide film, a process gas containing at least either of a $BrF_3$ gas and a $BrF_5$ gas can be used. With the combination, a protective film made of a non-volatile material (e.g., $SiO_xBry$) is generated by the Br element present in the process gas, so that the function of etching the silicide film is satisfactorily sustained. On the other hand, a volatile material (e.g., $WF_5$ or $SiF_4$) is generated through the reaction between the deposition species and the $BrF_3$ gas or the like at the wall surface of the reaction chamber which is barely influenced by the plasma, thereby suppressing the deposition of the reaction products on the wall surface of the reaction chamber and the like.

As the process gas, it is possible to use a gas with the function of anisotropic etching and at least either of a $XeF_2$ gas and a diluted $F_2$ gas. It is also possible to add an oxygen gas thereto. With the anisotropic etching gas, a non-volatile material (e.g., $SiO_xBr_y$) is generated at the semiconductor substrate, which protects the side walls of the openings, thereby performing anisotropic etching. On the other hand, a volatile material (e.g., $WF_6$ or $SiF_4$) is generated through the reaction between the deposition species and the $XeF_2$ gas or the $F_2$ gas on the inner surface of the reaction chamber which is barely influenced by the plasma, so that the deposition of the reaction products on the inner surface of the reaction chamber is suppressed.

If the supply of the interhalogenous gas in the above-mentioned dry-etching method is stopped directly before the removal of the portion to be etched is completed so that the etching process is continued thereafter by the fluorocarbon gas to which the radio-frequency voltage has been applied, the amount of the polymers formed from the fluorocarbon gas by plasma polymerization is increased. The resulting polymer film covers and protects the underlying layer, so that the underlying layer is protected against exceeding etching.

If the amount of the interhalogenous gas being supplied is gradually lowered toward the complete removal of the portion to be etched in the above-mentioned dry-etching method, the underlying layer is also protected by the polymer film so that the underlying layer is protected against the exceedingly etching.

If, after the removal of the portion to be etched is completed, the application of the radio-frequency voltage is stopped so that at least the interhalogenous gas remains in the chamber in the above-mentioned dry-etching method, the interhalogenous gas is continuously supplied even after the plasma-etching effect is stopped. Consequently, the damaged layer formed in the underlying layer by plasma etching is removed by the chemical polishing effect in the manner of self-alignment.

To attain the above second object, the chemical vapor deposition method of the present invention comprises the steps of: disposing in a reaction chamber a semiconductor substrate; introducing into the reaction chamber a process gas containing at least a main gas with the function of forming, in the state of plasma, a film on the above semiconductor substrate and an additional gas for generating, in the state of non-plasma and with activation energy lower than a specified level, a volatile material by reaction with a deposition species so as to contribute to the suppression of film formation; and forming a film on the above semiconductor substrate by chemical vapor deposition by turning the above process gas into a plasma in the above reaction chamber.

In performing chemical vapor deposition by the above method, radicals resulting from the decomposition of the process gas are turned into a plasma and polymerized, thereby forming a film on the semiconductor substrate. On the other hand, the wall surface of the reaction chamber is barely influenced by the plasma during the deposition of the film, so that the reaction between the deposition species and the additional gas is caused preferentially, resulting in a volatile material. As a result, the deposition of the reaction products on the wall surface of the reaction chamber and the like is suppressed without preventing the formation of a CVD film on the semiconductor substrate. Consequently, the time period during which the reaction chamber can be used continuously is increased.

In the above chemical vapor deposition method, it is also possible to use the interhalogen compound gas as the above additional gas for the same reason as described above for the dry etching method.

In the above chemical vapor deposition method, if the film contains silicon as its component, a silicon-containing gas is used as the above main gas. In this case, silicon atoms contained in the main gas serve as a component of the deposition species, though a material resulting from the reaction between the interhalogen compound and the silicon atoms is non-volatile in the state of non-plasma. Consequently, the effect of suppressing the deposition of the reaction products on the inner surface of the reaction chamber can surely be achieved.

In the above chemical vapor deposition method, it is also possible to use at least either of the $XeF_2$ gas and a diluted $F_2$ gas as the above additional gas. In this case, since Cl atoms are not allowed to enter into the CVD film formed on the semiconductor substrate, the adverse effects which might have been exerted on the semiconductor apparatus by the Cl atoms can surely be avoided.

The following are proper combinations of the material of a film to be deposited and a main gas in the above chemical vapor deposition method.

In the case of depositing a silicon dioxide film, a main gas containing a silane gas can be used.

In the case of depositing a silicon nitride film, a main gas containing a dichlorosilane gas and an ammonia gas can be used.

In the case of depositing a BPSG film, a main gas containing a silane gas, a phosphine gas, and a diborane gas can be used.

Next, to attain the above third object, an apparatus for processing a semiconductor substrate in which a chemical process such as plasma CVD or plasma etching is performed with respect to the semiconductor substrate by turning a process gas into a plasma comprises: a chamber for defining a space in which the above chemical process is to be performed; a gas inlet provided in a wall of the above chamber for introducing the process gas into the chamber; a gas outlet provided in a wall of the above chamber for discharging the gas out of the chamber; a substrate holder disposed in the above chamber for holding the above semiconductor substrate; a plasma generator disposed in the above chamber for turning the process gas into a plasma; an injector having a large number of minute holes provided in the above chamber and connected to the above gas inlet, through which the process gas is injected vertically and horizontally to the above substrate holder in the chamber; and discharging means for discharging the process gas out of the above chamber.

With the above structure, if the reactive gas is introduced into the chamber through a number of small holes at high uniformity in this structure, the amount of the polymers produced by plasma polymerization, i.e., the production of the polymer film, is reduced in the vicinity of the small holes. Since the holes are formed in the side portion as well as in the top portion of the chamber, the amount of dust deposited on the inner wall of the chamber is reduced, thereby reducing the adverse effect exerted by the dust on the semiconductor device. Moreover it is not necessary to maintain the etcher by cleaning.

In the above apparatus for processing a semiconductor, the above gas inlet may be composed of a first inlet provided in a wall of the above chamber opposed to the substrate holder and of at least one second inlet provided in a wall of the above chamber lateral to the substrate holder and the above injector may be composed of a first injecting member consisting of the above large number of minute holes formed in a disk provided along the contour of a circular region including the above first inlet in a wall of the above chamber and of a second injecting member consisting of the above large number of minute holes formed in a cylinder provided along the contour of a cylindrical region including the above second inlet of the above chamber.

In the above apparatus for processing a semiconductor substrate, the above injector may be substantially spherical and the above substrate holder may be disposed in the vicinity of the center of the above spherical injector. Thus, the reactive gas is supplied at high speeds through the small holes formed over the spheric inner wall of the chamber, so that the amount of dust is significantly reduced, because the surface area of inner chamber is smaller than that of cylindrical chamber.

In the above apparatus for processing a semiconductor substrate, the above injector may comprise: a double cylindrical member consisting of an internal cylindrical element formed with a large number of minute holes which has one end open and the other end provided with an end plate and an external cylindrical element which has one end open and the other end provided with an end plate so that the end plate of the above external cylindrical element and the end plate of the above internal cylindrical element are on the same side of the above substrate holder, the above internal cylindrical element being combined with the above external cylindrical element so that a specified cylindrical space is formed therebetween; a gas inlet provided in the external cylindrical element of the above double cylindrical member for introducing the process gas into the above cylindrical space; and a piping member for connecting the gas inlet of the above chamber to the gas inlet of the above double cylindrical member.

With the above structure, in introducing the process gas for the semiconductor substrate into the space inside the internal cylindrical element of the double cylindrical member which constitutes the reaction chamber in the chamber, the process gas is injected through each of the minute holes in the internal cylindrical element. As a result, the process gas is allowed to flow along the entire wall surface of the reaction chamber, so that the deposition of the reaction products on the wall surface of the reaction chamber is suppressed. Consequently, the time period during which the chamber can be used continuously till subsequent maintenance is performed for the removal of the deposition films is increased.

In the above apparatus for processing a semiconductor substrate, each of the minute holes in the cylindrical surface of the internal cylindrical element of the above double cylindrical member is preferably larger in diameter than each of the minute holes in the end plate of the above internal cylindrical element. With the structure, the velocity of the processing gas through the minute holes becomes uniform, so that the deposition of the reaction products on the wall surface of the reaction chamber can surely be suppressed.

In the above apparatus for processing a semiconductor substrate, each of the minute holes in the above internal cylindrical element may be formed so that its numerical aperture increases as the distance from the above discharging means increases. With the structure, the velocity of the process gas through the minute holes becomes substantially uniform, which ensures the effect of suppressing the deposition of the reaction products.

In the above apparatus for processing a semiconductor substrate comprising the double cylindrical member, it is possible to provide the following means for the purpose of simplifying its structure.

At least one gas inlet of the above double cylindrical member may be formed substantially at the center of the end plate of the above external cylindrical element.

At least a part of said external cylindrical element may also serve as a wall of the chamber.

In the above apparatus for processing a semiconductor substrate, a part of the above end plate of the external cylindrical element of the above double cylindrical member may also serve as a wall of the above chamber and the gas inlet of the above double cylindrical member may also serve as the gas inlet of the chamber.

The above apparatus for processing a semiconductor substrate may be a parallel plate RIE system having, as the above plasma generator, a first plate electrode and a second plate electrode disposed in parallel in the above chamber and the above substrate holder may be disposed between the above first electrode and second electrode and in the vicinity of the above second electrode.

With each of the above structures, an apparatus of simplified structure can be implemented at lower manufacturing cost.

Next, in an apparatus for processing a semiconductor substrate, the above chamber may be divided into a first unit in which the external cylindrical element of the above double cylindrical member is disposed and a second unit in which the internal cylindrical element of the above double cylindrical member is disposed and the above first unit may be detachable from the above second unit. With the above structure, it becomes possible to promptly carry out the operation of maintenance.

It is possible to provide a gas-flow resistance plate having the function of resisting the flow of the process gas between the end plate of the above internal cylindrical element of the above double cylindrical member and the end plate of the above external cylindrical element of the above double cylindrical member. With the structure, even if the process gas flowing through the gas inlet tries to make a direct entrance into the reaction chamber through the minute holes in the end plate of the internal cylindrical element, the resistance plate prevents the direct entrance of the process gas, so that the process gas passes through the space between the resistance plate and the internal cylindrical element before flowing through the minute holes in the end plate. Consequently, the velocity of the process gas through the minute holes in the side portion and end plate of the internal cylindrical element becomes uniform, thereby suppressing the deposition of the reaction products on the wall surface of the reaction chamber.

In the above apparatus for processing a semiconductor substrate or in an apparatus for processing a semiconductor substrate which uses a plasma but does not have a large number of minute holes for injecting the process gas, at least the surface of the above first electrode may be composed of carbon. With the structure, if a carbon electrode instead of a silicon electrode is used in a conventional apparatus, etching characteristics tend to change with the passage of time or deteriorate because of high rate at which the products are deposited according to the condition in the chamber, though the selectivity of dry etching is high. However, since the generation of the deposition is suppressed by the presence of the interhalogen compound gas or the like, etching with high selectivity can be performed, while its characteristics do not change or deteriorate with the passage of time.

In the above apparatus for processing a semiconductor substrate or in an apparatus for processing a semiconductor substrate in which dry etching or CVD is performed without using a plasma, it is possible to provide: cleaning-gas supplying means for supplying a cleaning gas which generates, in the state of non-plasma and with activation energy lower than a specified level, a volatile material from a deposition species resulting from the reaction of the process gas in the above chamber so as to contribute to the suppression of film formation; a gas exhaust pipe attached to the above outlet; and a cleaning-gas injector attached to the above gas exhaust pipe for injecting into the gas exhaust pipe the cleaning gas supplied from the above cleaning-gas supplying means. With the structure, the deposition of the reaction products on the wall surface of the exhaust pipe can be suppressed.

BRIEF DESCRIPTION OF THE DRAWINGS

FIG. 18 is a cross-sectional view partially showing the structure of an apparatus for processing a semiconductor substrate according to a sixth embodiment;

DETAILED DESCRIPTION OF THE PREFERRED EMBODIMENTS

EXAMPLE 1

Figure 1:
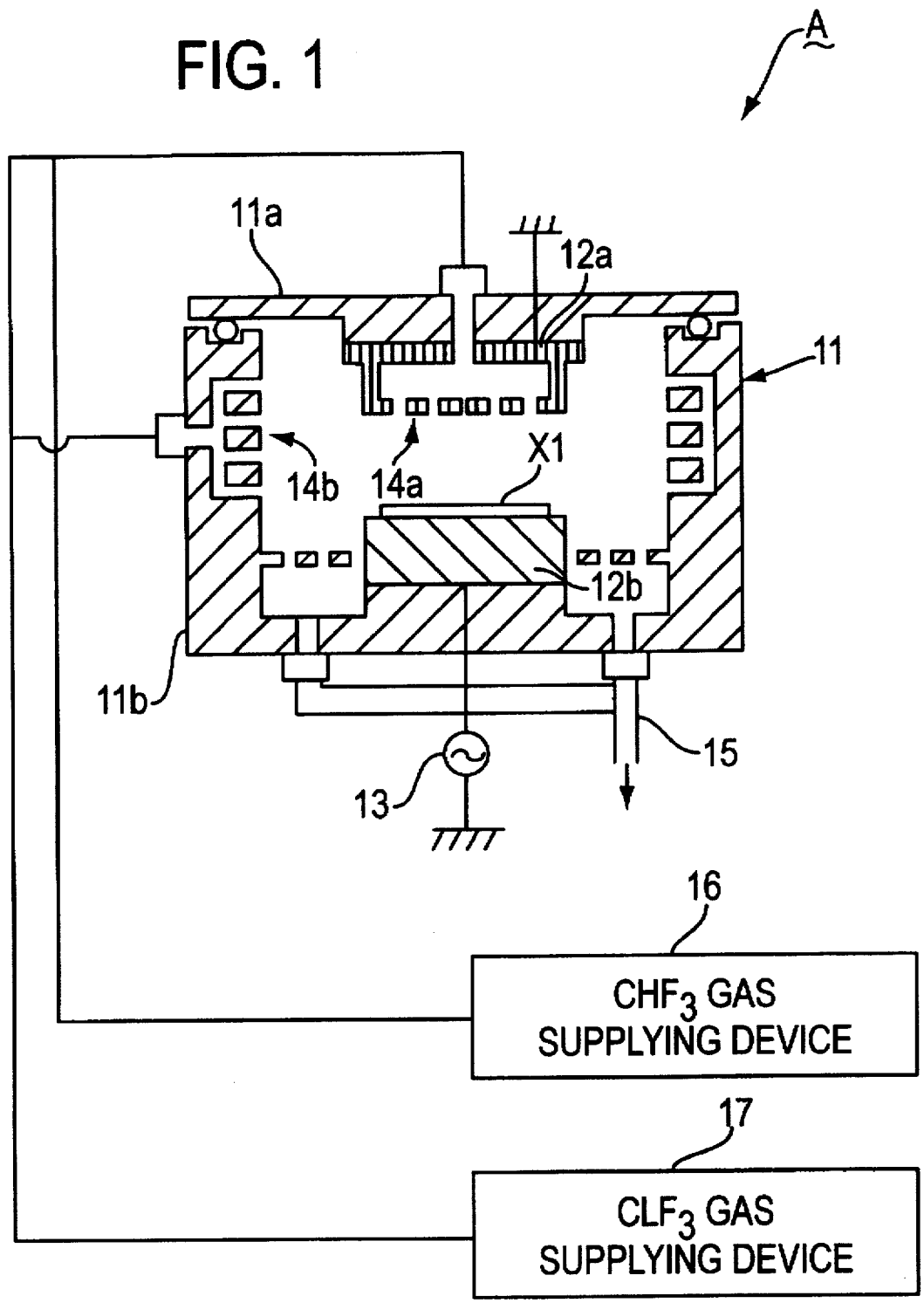
FIG. 1 is a cross-sectional view diagrammatically showing an etching apparatus of a first embodiment.

FIG. 1 diagrammatically shows a RIE-mode etching apparatus A which includes a casing consisting of a cylindrical chamber body 11b with the open top and the closed bottom and a lid 11a for closing the chamber body 11b. In the casing are provided a pair of electrodes 12a and 12b which are opposed to each other. A silicon substrate X1 to be processed is placed on the lower electrode 12b which is connected to a radio-frequency power supply 18. A gas-supply line is provided through the upper electrode 12a which is formed on the inner side of the lid 11a mentioned above. The lower portion of the upper electrode 12a is formed with a plurality of top gas-supply holes 14a. Another gas-supply line is provided through one of the side walls of the chamber body 11b, which is also formed with a plurality of side gas-supply holes 14b. The bottom portion of the chamber body 11b is formed with exhaust holes 15. The gas-supply holes are arranged at equal intervals with each other on the inner surface of the chamber.

The gas-supply lines mentioned above are connected to a $CHF_3$ gas supplying device 16 and a $ClF_3$ gas supplying device 17, respectively, so that the mixture gas of $CHF_3$ and $ClF_3$ can be supplied into the chamber of the etching apparatus A. The etching apparatus A is constituted so that a plasma is produced in the gas by applying a radio-frequency voltage of 13.56 MHz across the electrodes 12a and 12b with the power of 250 W while maintaining the inside pressure at 100 mTorr by using a vacuum pump via the exhaust hole 15, thereby conducting the etching of a silicon-nitride film.

FIGS. 2(a) to 2(e) show cross sections of the silicon substrate X1 in the LOCOS forming steps.

Figure 2A:
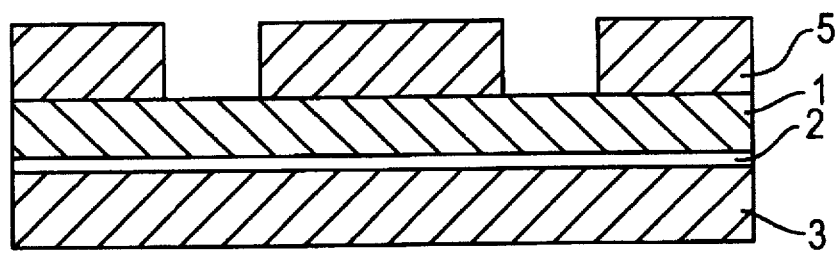
FIG. 2(a) is a cross-sectional view showing a silicon substrate when a photoresist film is patterned in the LOCOS forming process according to the first embodiment.

As shown in FIG. 2(a), a silicon-dioxide film 2 and a silicon-nitride film 1 are successively deposited on a silicon substrate 3 to the thickness of 10 nm and to the thickness of 160 nm, respectively. Then, a photoresist film 5 is applied to the surface of the silicon-nitride film 1, so as to be patterned.

Figure 2B:
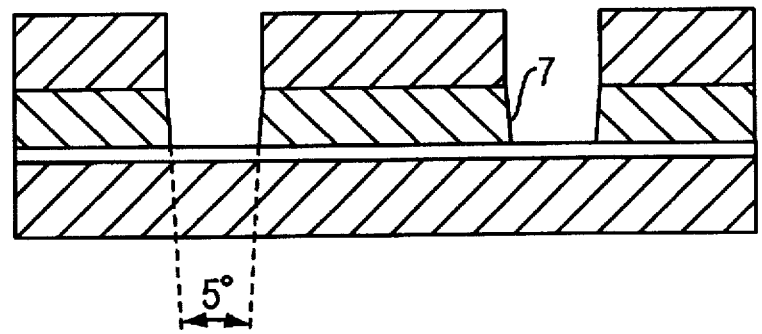
FIG. 2(b) is a cross-sectional view showing the silicon substrate when a silicon-nitride film is etched selectively.

Subsequently, as shown in FIG. 2(b), dry etching is performed by using the photoresist film 5 as a mask so as to form an opening 7 for the LOCOS by selectively removing the portions of the silicon-nitride film 1 corresponding to the opening of the photoresist film 5. Meanwhile, the $ClF_3$ gas and $CHF_3$ gas are introduced to the chamber at the flow rates of 4 $cm^3$/min and 40 $cm^3$/min.

Figure 2C:
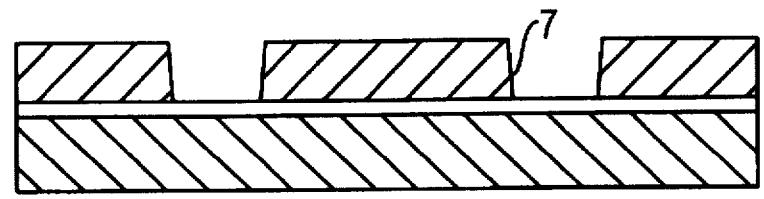
FIG. 2(c) is a cross-sectional view showing the silicon substrate when the photoresist film is removed.

Thereafter, as shown in FIG. 2(c), the photoresist film 5 is removed by ashing, thus forming the silicon-nitride film 1 into a pattern with the opening 7 corresponding to the region in which the LOCOS is to be formed.

Figure 2D:
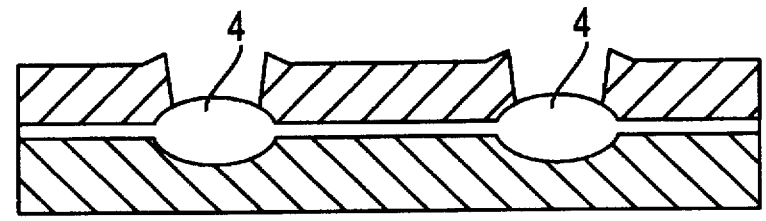
FIG. 2(d) is a cross-sectional view showing the silicon substrate on which the LOCOS is formed.

Next, as shown in FIG. 2(d), the formation of the LOCOS 4 is carried out by selective oxidation with the use of the silicon-nitride film 1 as a mask.

Figure 2E:
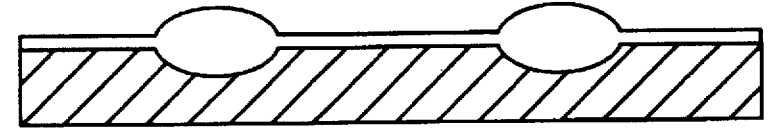
FIG. 2(e) is a cross-sectional view showing the silicon substrate when the silicon nitride film is removed.

After that, as shown in FIG. 2(e), the silicon-nitride film 1 alone is removed by a wet-etching method using an etchant containing a heated phosphoric acid as the main component.

According to the dry-etching method of the present embodiment, the side wall of the silicon-nitride film 1 after the etching is tapered at an angle of approximately 5°, as shown in FIG. 2(b). Compared with the angle of 60° obtained above by the conventional dry-etching method, the angle of 5° obtained in the present embodiment is significantly small, so that the opening 7 is formed roughly vertical from the opening of the photoresist film 5. Consequently, the silicon-nitride film 1 presents only slight shift from the mask pattern at its bottom ends. This can be explained by the following phenomenon.

Figure 3A:
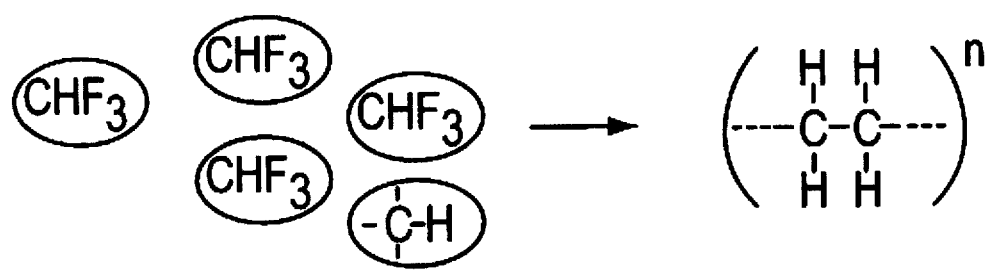
FIG. 3(a) is a view illustrating the formation of a polymer film by plasma polymerization.
Figure 3B:
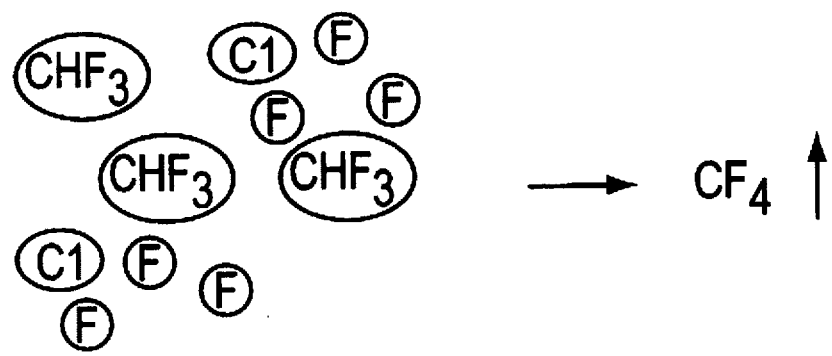
FIG. 3(b) is a view illustrating the formation of a volatile material from halogen radicals.

When the mixture gas of a typical fluorocarbon gas such as $CHF_3$, $CH_2F_2$, and $CF_4$ and an $O_2$, $H_2$ or like gas is used as the etchant gas, carbon atoms or carbon hydride resolved from fluorocarbon gas and photoresist volatile by the generation of $SiF_4$ are subjected to radical polymerization, thus forming polymers resulting in a polymer film, as shown in FIG. 3(a). However, if a $ClF_3$ gas is included, as shown in FIG. 3(b), the inner wall of the apparatus, the electrodes, and the surface of the substrate are covered with a large amount of fluorine and chlorine radicals when the $ClF_3$ gas is introduced into the apparatus prior to the generation of a plasma, for the molecules of the $ClF_3$ gas generate a large amount of fluorine and chlorine radicals in the absence of the plasma. The plasma is then generated by the application of a radio-frequency voltage, so that carbon atoms or carbon hydride dissociated from the CHF$_3$ molecules react with a large amount of fluorine radials generated from the ClF$_3$ gas to form a large amount of carbon-fluorine bonds on the inner wall of the apparatus, on the electrodes, and on the silicon substrate X, resulting in CF$_4$ molecules to be vaporized. Consequently, the number of bonds between carbon (C) atoms decreases and the production of the polymer film is minimized.

In the conventional plasma etching, such undercuts as formed by isotropic etching do not occur because anisotropic etching is performed and the sidewalls of the silicon-nitride film are protected by the above-mentioned polymer films. However, the etching effect is not fully exerted in the lateral direction due to the excessive deposition of the polymer film, resulting in the tapered configuration of the opening 7. In the present embodiment, however, the deposition of the polymer film is appropriately controlled by adding a gas which does not necessitates the presence of the plasma such as ClF$_3$, so that the side walls of the silicon-nitride film present substantially vertical edge profiles, resulting in the slight shift pattern.

In addition, the generation of the polymer film is controlled, which significantly reduces the production of dust.

As described above, an interhalogenous gas, instead of an oxygen or like gas, is added to a fluorocarbon gas, so that the pattern shift is minimized and the generation of dust is prevented. Thug; the etching process facilitates the fabrication of highly intense and extremely miniaturized semiconductor devices.

Figure 4:
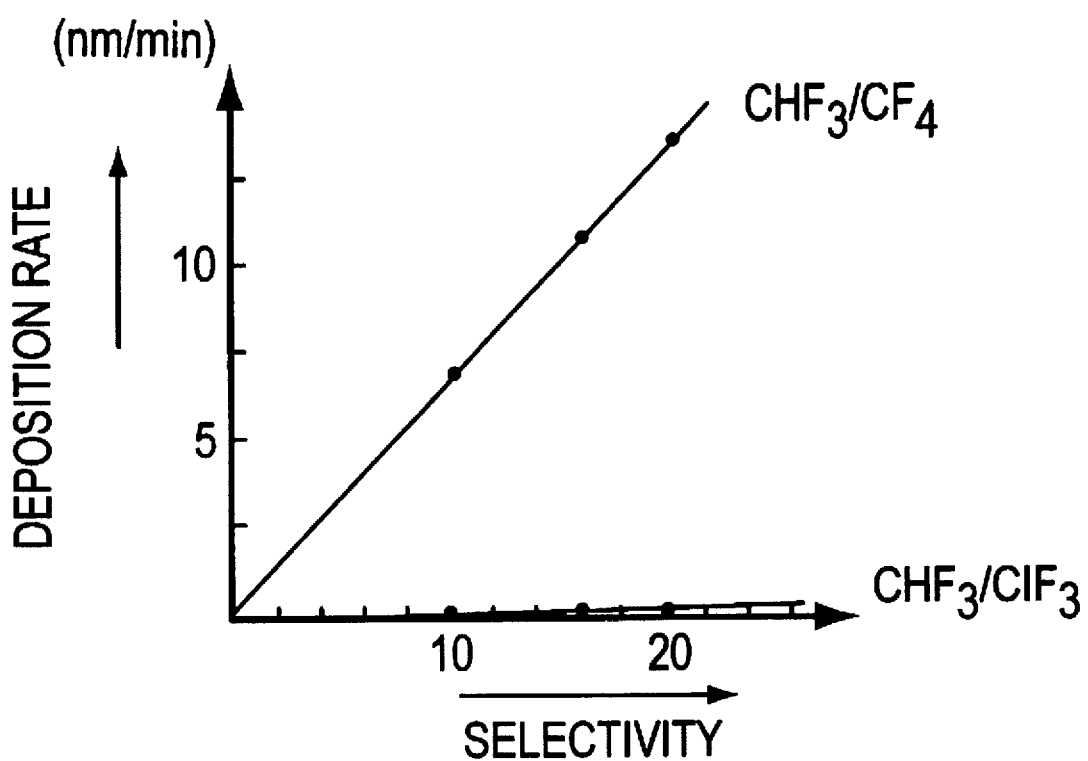
FIG. 4 is a view showing the characteristics of the deposition rates and selectivities of a conventional mixture gas of $CHF_3$ and $CF_4$ and of a mixture gas of $CHF_3$ and $ClF_3$ related to the embodiment.

FIG. 4 shows the results of experiments for examining the selectivities and deposition rates of a mixture gas used in the conventional method and of a mixture gas used in the present method. The conventional method used the mixture gas of CHF$_3$ and CF$_4$, which is commonly used for forming the contact holes. The selectivity is given as the ratio of the etching rate for a BPSG film to the etching rate for a polysilicon layer, which means that the degree of damage of the polysilicon substrate is in inverse proportion to the selectivity. Although the experiment used a polysilicon film for the underlying layer, the selectivity will be increased if the underlying layer is composed of a single-crystal layer. The deposition rate is given as the thickness of the polymer film deposited on the inner wall of the chamber per unit time.

As shown in FIG. 4, the deposition rate and the selectivity in the mixture gas of CHF$_3$ and CF$_4$ are increased as the volume ratio of the CF$_4$ gas to the whole mixture gas is decreased. In the mixture gas of CHF$_3$ and ClF$_3$, the deposition rate and the selectivity are increased as the volume ratio of the ClF$_3$ to the whole mixture gas is decreased. The results confirm that the ClF$_3$ gas generates a large amount of radicals in the absence of a plasma, whereas the CF$_4$ gas does not generate radicals in the absence of a plasma. Accordingly, the ClF$_3$ gas prevents the formation of the polymer film more effectively than the CF$_4$ gas does. Hence, the mixture gas of CHF$_3$ and ClF$_3$ can attain high selectivity which is necessary for reducing the degree of damage of the substrate and it can also prevent the formation of the polymer film more effectively than the conventional mixture gas that does not contain an interhalogenous gas, thus reducing the pattern shift and preventing the generation of dust.

In forming the contact holes, it is also possible to lower the flow rate of the ClF$_3$ gas toward the completion of the process, though detailed description of the procedure is omitted here.

EXAMPLE 2

Figure 23:
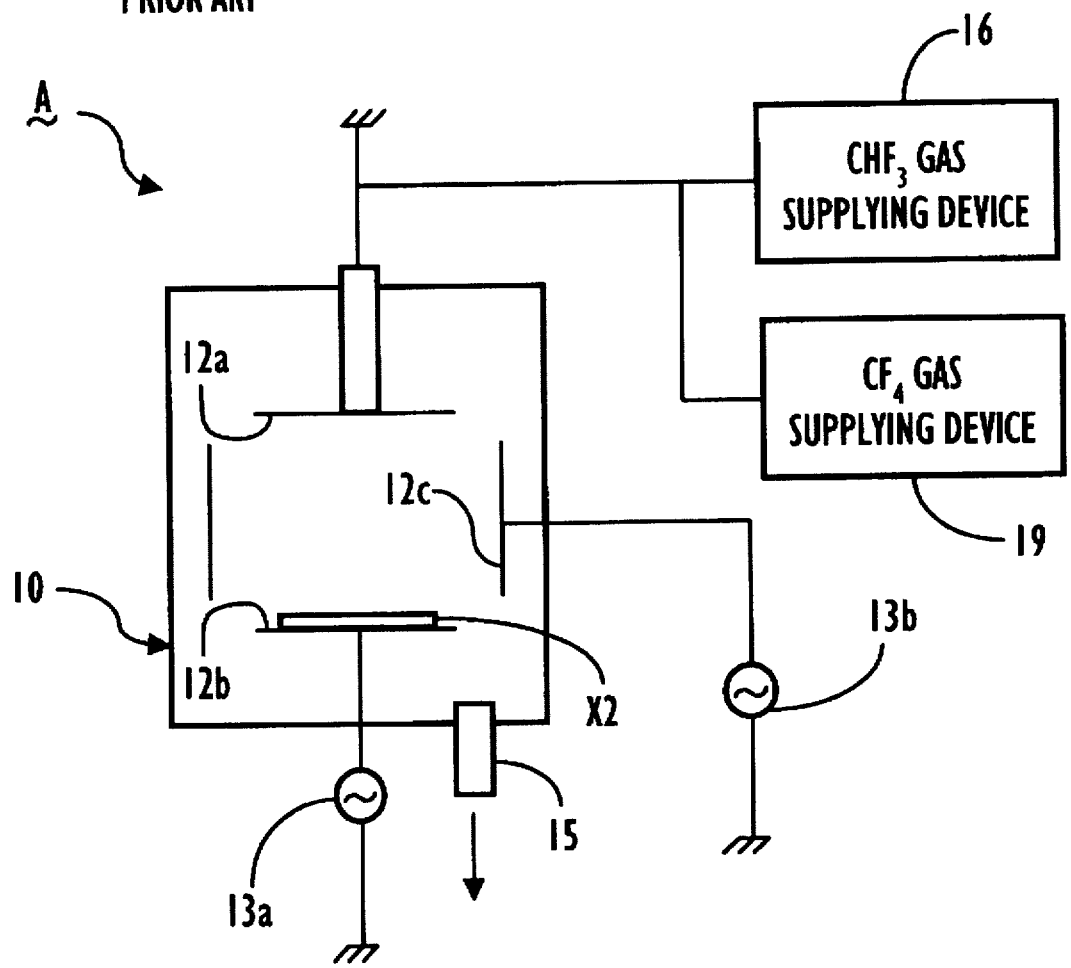
FIG. 23 is a view diagrammatically showing the structure of a conventional etching apparatus for forming the contact holes.
Figure 24:
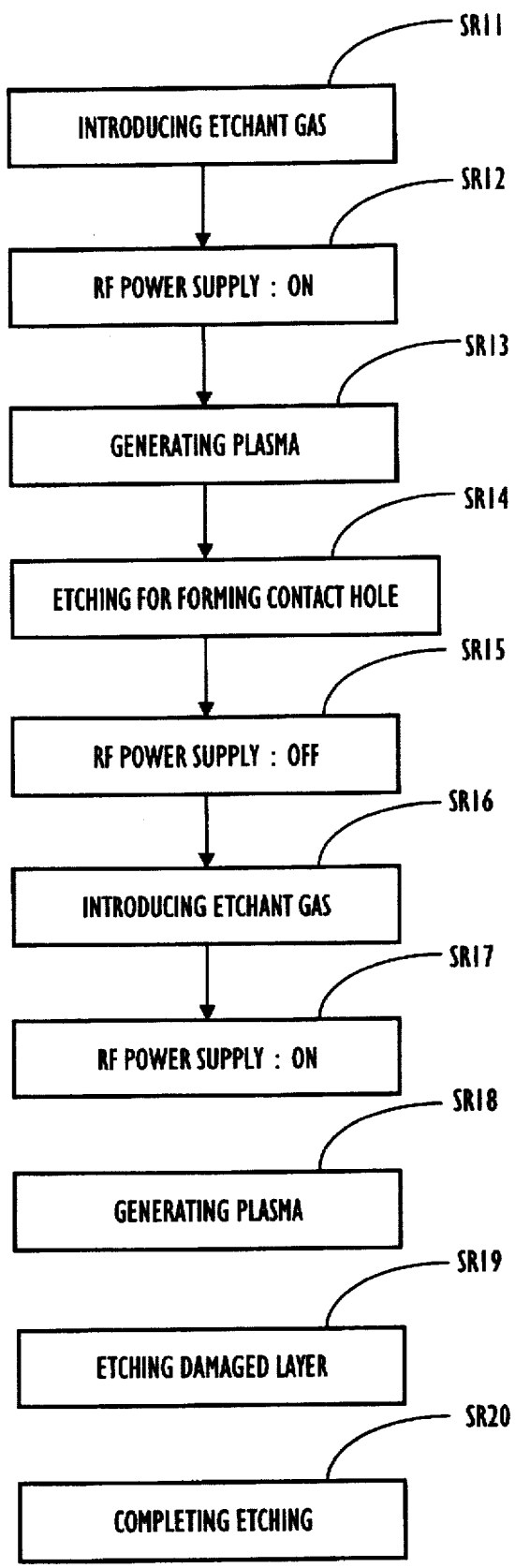
FIG. 24 is a flow chart showing conventional etching steps for forming the contact holes.

In the second embodiment, the dry etching process for forming the contact holes will be described with reference to FIGS. 5 and 6. The present embodiment employs an etching apparatus in the three-electrode mode which has roughly the same structure as that shown in FIG. 23. In this embodiment, however, the ClF$_3$ gas supplying device instead of the CF$_4$ gas supplying device is connected to the apparatus.

Figure 5A:
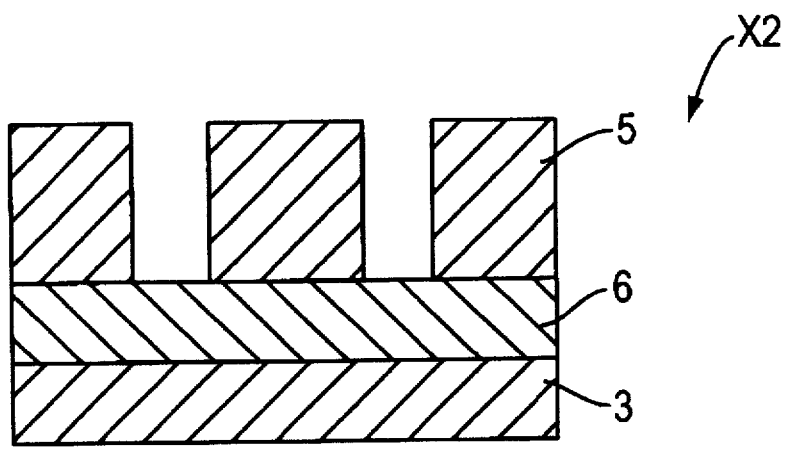
FIG. 5(a) is a cross-sectional view showing a silicon substrate when a photoresist film is patterned in the etching process for forming contact holes according to a second embodiment.
Figure 5B:
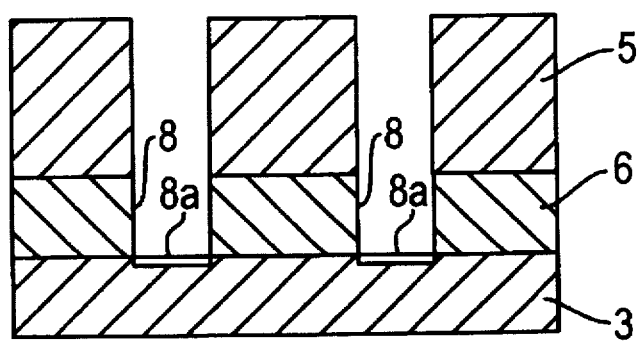
FIG. 5(b) is a cross-sectional view showing the silicon substrate when the contact holes are formed.
Figure 5C:
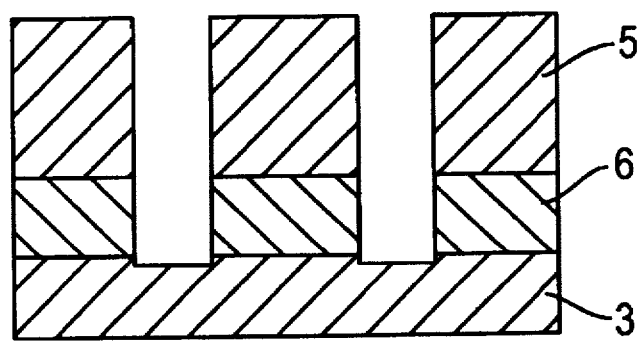
FIG. 5(c) is a cross-sectional view showing the silicon substrate when a damaged layer at the bottom portion of the contact hole is removed.

FIGS. 5(a) to 5(c) show the procedure of the etching steps for forming the contact holes.

First, as shown in FIG. 5(a), a BPSG film 6, which is a silicon-dioxide film containing boron and phosphorus, is deposited on a silicon substrate 3. On the BPSG film 6, a photoresist film 5 is formed into a pattern.

Subsequently, the resulting substrate X2 is mounted on the etching apparatus so as to be dry-etched in the following procedure: first, in the step ST11 of FIG. 6, the ClF$_3$ gas and the CHF$_3$ gas are introduced into the etching apparatus at the flow rates of 2 cm$^3$/min and 120 cm$^3$/min, respectively, to serve as the etchant gas; in the step ST12, the radio-frequency power supply is activated; and in the step ST13, a plasma is produced, which performs the etching for forming the contact holes. More specifically, as shown in FIG. 5(b), the BPSG film 6 is selectively removed by dry etching with the photoresist film 5 used as the mask, so that a contact hole 8 is opened. Since the silicon substrate 3 is also affected by the etching effect, a damaged layer is formed on the surface portion of the silicon substrate 3, which is exposed to the bottom portion 8a of the contact hole 8.

Figure 6:
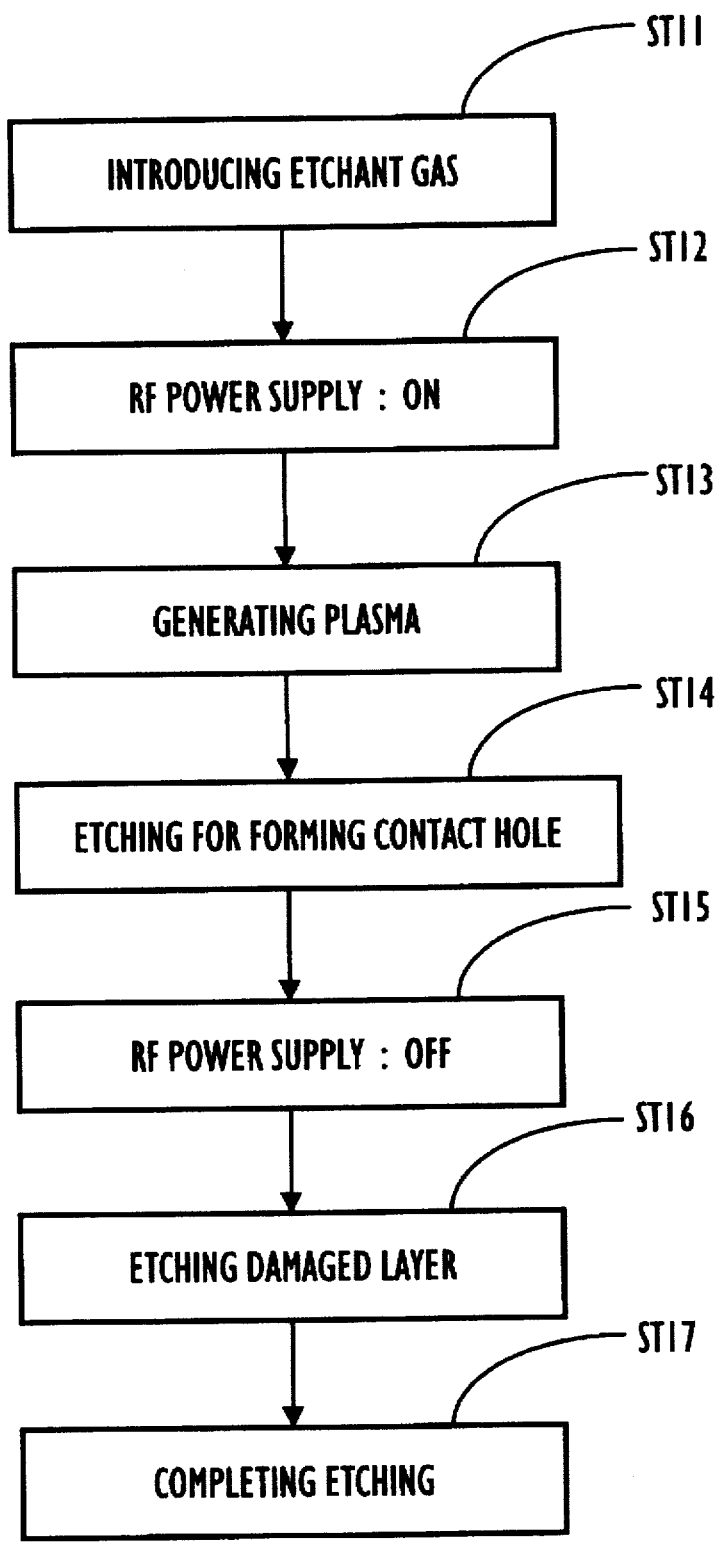
FIG. 6 is a flow chart showing the procedure of the etching steps in the second embodiment.

Then, in the step ST15 of FIG. 6, the radio-frequency power supply 13 is switched off with the ClF$_3$ gas remaining in the etching apparatus. Because the ClF$_3$ gas generates a large amount of fluorine and chlorine radicals in the absence of a plasma, as described above, the damaged layer formed in the bottom portion 8a of the contact hole 8 in the step ST16 of FIG. 6 is subjected to etching which is not assisted by a plasma, so that the damaged layer is removed by the chemical polishing effect in the manner of self-alignment.

In accordance with the etching method of the present embodiment, the pattern shift is reduced and the polymers are not substantially formed on the inner wall of the chamber even when the CHF$_3$ gas is used, which significantly reduces the production of dust. Moreover, since it is not necessary to provide extra steps for removing the damaged layer, unlike the conventional etching steps for forming the contact holes, the etching process can be composed of reduced steps.

Figure 7:
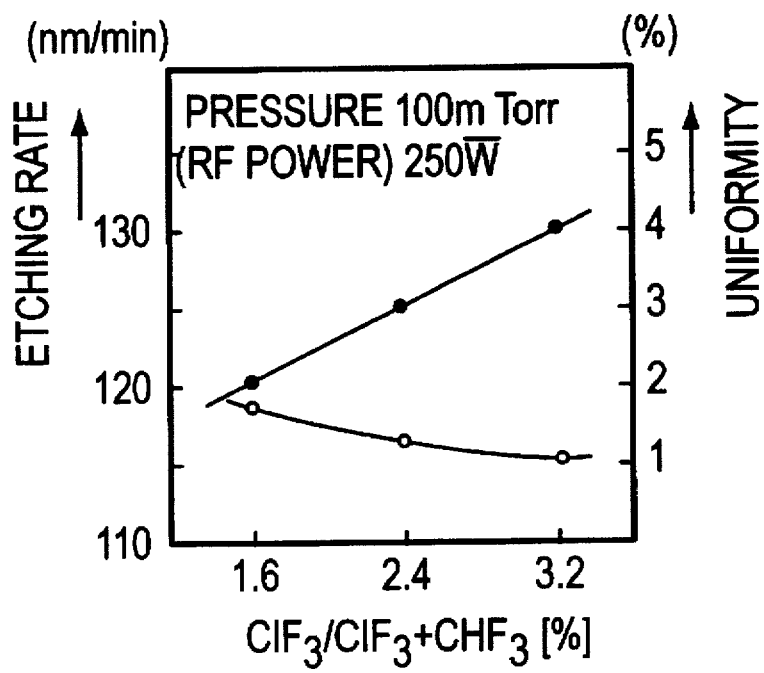
FIG. 7 shows the results of experiments for examining the dependence of the etching rate and uniformity for a BPSG film on the concentration of a $ClF_3$ gas.
Figure 8:
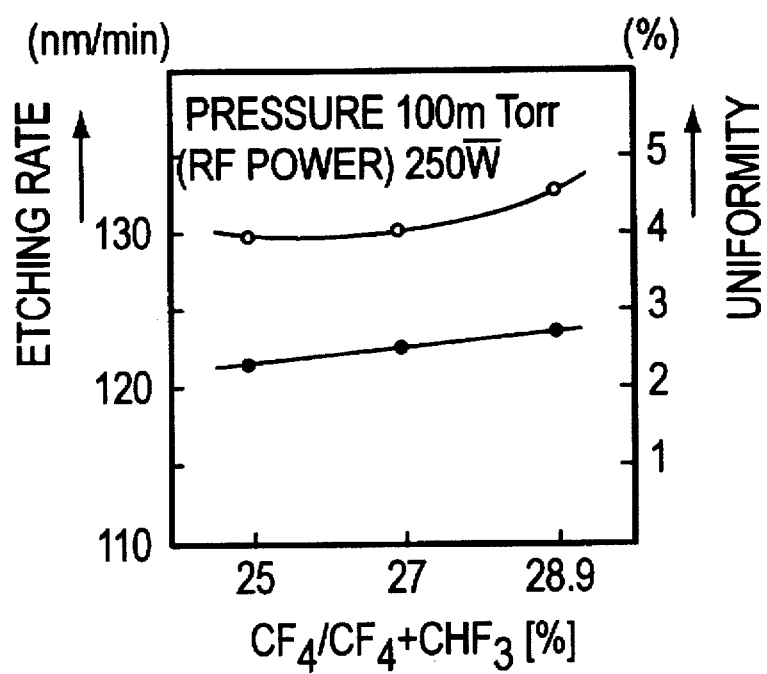
FIG. 8 shows the results of experiments for examining the dependence of the etching rate and uniformity for a BPSG film on the concentration of a $CF_4$ gas when an interhalogenous gas is not used.

FIGS. 7 and 8 are views showing the characteristics of the etching rate (plotted as black circles) and the etching uniformity (plotted as white circles) for comparison. FIG. 7 shows the characteristics which were obtained by using the mixture gas of ClF$_3$ and CHF$_3$ in the embodiment of the present invention. FIG. 8 shows the characteristics which were obtained by using the mixture gas of CF$_4$ and CHF$_3$ in the conventional embodiment. The etching uniformity $E_{uni}$ is given by the following equation:

$$E_{uni}=(T_{max}-T_{min})/(T_{max}+T_{min})$$

(wherein $T_{max}$ represents the maximum thickness of the remaining film in the formation of the contact hole and $T_{min}$ represents the minimum thickness thereof).

The results obtained show that the etching rate obtained in the present embodiment is substantially the same as the etching rate obtained in the conventional embodiment, while the etching uniformity obtained in the present embodiment is superior to the etching uniformity obtained in the conventional embodiment. This means that the distribution of radicals generated during the etching is uniform over the surface of the wafer and that the polymer films is also uniformly formed. The results also show that the uniformity is constantly increased even when the volume ratio of the $ClF_3$ gas to the whole mixture gas is increased and the etching rate is increased. Since the surface irregularity of underlying silicon after the formation of the contact holes is reduced with the increase in etching uniformity, the degree of damage of the underlying layer can be reduced.

EXAMPLE 3

The third embodiment will be described below.

The present embodiment uses the same etching apparatus and the same silicon substrate X1 as used in the foregoing first embodiment (see FIGS. 1 and 2).

Figure 9:
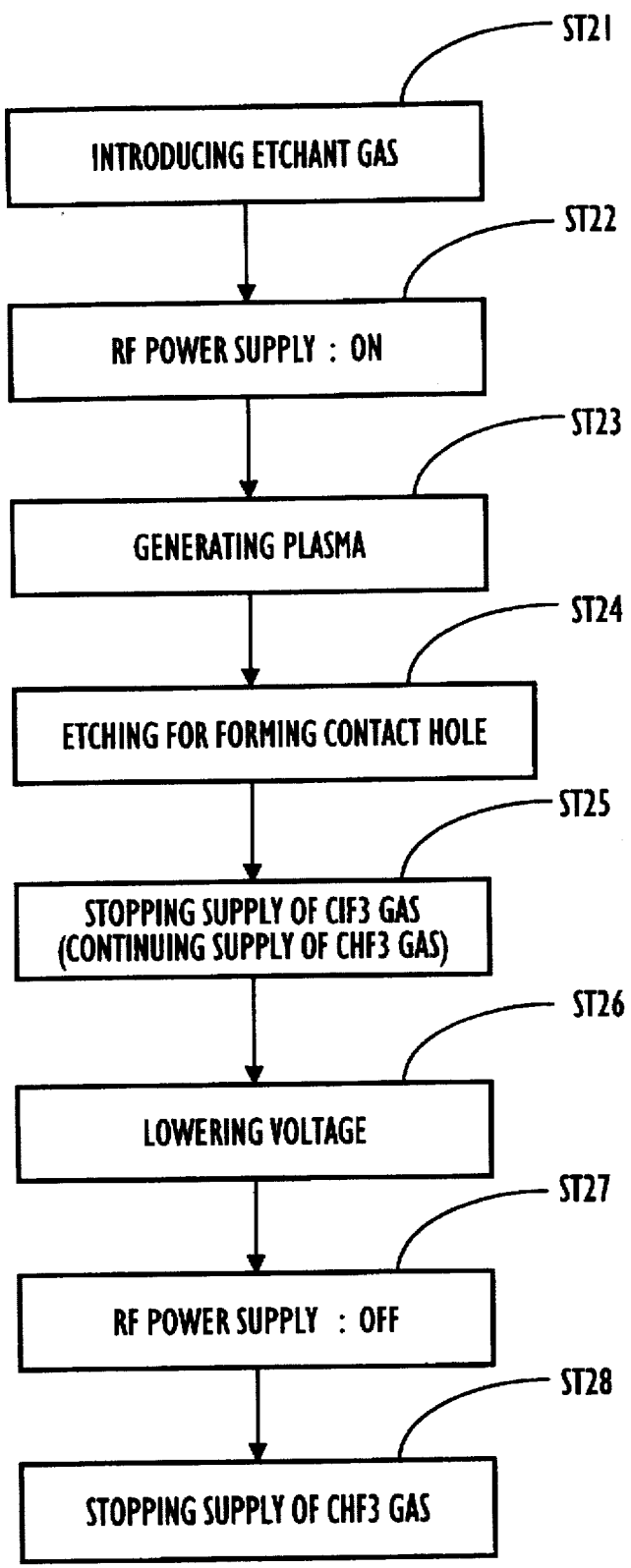
FIG. 9 is a flow chart showing the etching steps for forming the contact holes in a third embodiment.

FIG. 9 shows the sequence of steps for forming the opening of the silicon-nitride film which is used as the mask for forming the LOCOS: in the step ST21, the $CHF_3$ gas and $ClF3$ gas are introduced as the etchant gas; in the step ST22, the radio-frequency voltage is applied; in the step ST23, a plasma is produced; in the step ST24, the opening of the silicon-nitride film 1 is formed by using the resulting plasma; in the step ST25, the supply of the $ClF_3$ gas is stopped directly before the formation of the opening is completed, that is, when the unetched layer of the silicon-nitride film 1 on the underlying silicon-dioxide film 2 becomes extremely thin, while the supply of the $CHF_3$ gas is solely continued; in the step ST26, the voltage from the radio-frequency power supply is lowered; in the step ST27, the power supply is stopped after a specified period of time; and in step ST28, the supply of the $CHF_3$ gas is stopped.

In the third embodiment, the supply of the $ClF_3$ gas is stopped directly before the formation of the opening for the LOCOS is completed so that thereafter, the remaining film is removed solely by the plasma etching with the $CHF_3$ gas. If the $ClF_3$ gas is also supplied until the formation of the opening of the silicon-nitride film 1 is completed, the etching proceeds with the reduced production of the polymer films, so that the silicon-dioxide film 2 may significantly be etched after the silicon-nitride film 1 was removed. By stopping the supply of the $ClF_3$ gas alone directly before the formation of the opening is completed, as described above, the formation of the opening is completed with the etched surface covered with the growing polymer film, so that the surface of the underlying silicon-dioxide film 2 can be protected from the damage caused by dry etching.

Though the supply of the $ClF_3$ gas was stopped directly before the formation of the opening is completed in the third embodiment, a similar effect can be obtained by gradually reducing the amount of the $ClF_3$ gas being supplied toward the completion of the formation process.

The ratio of the flow rate of the interhalogenous gas to the flow rate of the whole reactive gas is preferably 50% or less with respect to the silicon-nitride film and preferably 10% or less with respect to the silicon-dioxide film.

Though the RIE-mode etching apparatuses were used in the above-described embodiments, the present invention is not limited thereto. Similar results can be obtained if a variety of etching apparatuses in three-electrode, magnetron RIE, ECR, and like modes are used instead.

Though the $CHF_3$ gas was used as the fluorocarbon gas in the embodiments described above, similar results can obtained if a $CH_2F_2$ gas is used instead. It is also possible that the reactive gas contains, e.g., an oxygen gas, in addition to the fluorocarbon gas and the interhalogenous gas.

In order to prevent the generation of dust resulting from the polymer film formed during etching, in particular, excellent effects can be obtained by adding an inert gas such as an argon gas.

EXAMPLE 4

Figure 10:
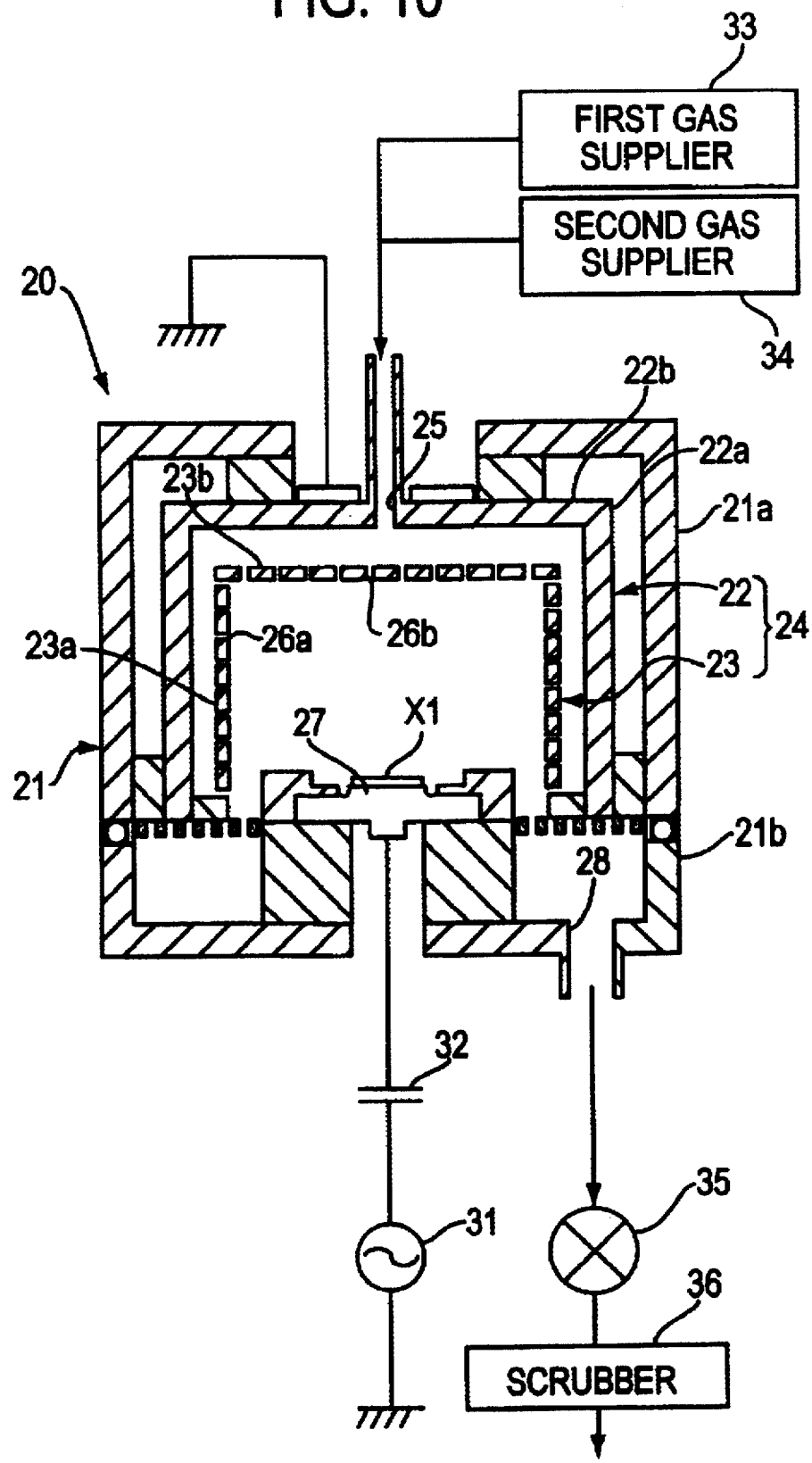
FIG. 10 is a cross-sectional view partially showing the structure of an apparatus for processing a semiconductor substrate according to a fourth embodiment.

A description will be given to a fourth embodiment with reference to FIG. 10 and to FIGS. 11(a) to 11(e): FIG. 10 shows the structure of an apparatus for processing a semiconductor substrate according to the fourth embodiment. In the apparatus for processing a semiconductor, there are disposed: a chamber 20 for performing a dry process such as the etching of a semiconductor apparatus X1 in a specified atmosphere or the formation of a CVD film; a radio-frequency power source 31; a matching capacitor 32; a first gas supplier 33; a second gas supplier 34; an exhaust pump 35; and a scrubber 36 for adsorbing a toxic exhaust gas. The casing of the above chamber 20 is divided into a lower casing 21b and an upper casing 21a, which is detachable from the lower casing 21b.

In the above upper casing 21a is disposed a double cylindrical member 24 consisting of an external cylindrical element 22 and an internal cylindrical element 23. The external cylindrical element 22 of the double cylindrical member 24 comprises a cylinder 22a having its lower end open and an end plate 22b provided on the upper end of the cylinder 22a. At the center of the end plate of the external cylindrical element 22 is provided a gas inlet 25 for introducing a process gas from the above first gas supplier 33 and from the above second gas supplier 34. On the other hand, the above internal cylindrical element 23 comprises a cylinder 23a and an end plate 23b provided on the upper end of the cylinder 23a. The lower end of the cylinder 23a is open so that it is engaged with the lower end of the cylinder 22a of the external cylindrical element 22. Between the external cylindrical element 22 and the internal cylindrical element 23 is provided a space. Each of the cylinder 23a and end plate 23b of the internal cylindrical element 23 is formed with a large number of minute holes 26 so that the process gas introduced from the above gas inlet 25 is allowed to flow through the space between the external cylindrical element 22 and the internal cylindrical element 23 and then injected into the chamber at high velocity through the above minute holes 26. Although the open end of the double cylindrical member 24 faces downward in the present embodiment, it is possible to arrange the double cylindrical member so that its open end faces upward. In this case, a semiconductor substrate to be processed is placed in an upper position and the process gas is supplied from below. It is also possible to arrange the double cylindrical member 24 so that its axis extends horizontally.

The present embodiment is characterized in that a minute hole 26a in the cylinder 23a of the above internal cylindrical element 23 is formed to be larger in diameter than a minute hole 26b in the end plate 23b. This prevents the process gas, which has been introduced from the gas inlet 25 in an upper position, from being injected only through the minute holes 26b in the end plate 23b and allows it to be supplied into the chamber at substantially uniform velocity through the minute holes 26 in each part of the internal cylindrical element 23.

The end plate 23b of the above internal cylindrical element 23 is made of a material obtained by coating SUS or Al with aluminum oxide and functions as an upper electrode (first electrode). In the central portion of the above lower casing 21b is disposed a lower electrode (second electrode) 27, which is connected to the radio-frequency power source 31 via the matching capacitor 32. The lower electrode 27 also functions as a stage for substrate, on which a semiconductor substrate X to be processed is mounted. With the above structure, the process gas is introduced into the chamber 20 and then radio-frequency power is applied to the space between the upper electrode 23b and the lower electrode 27, so that a CVD film is grown on the semiconductor substrate X1 or plasma etching is performed under an enhanced influence of a plasma in the space around the semiconductor substrate X1. Hence, the space inside the above internal cylindrical element 23 serves as a reaction chamber in the present embodiment.

To the upper casing 21a of the chamber 20 is attached the external cylindrical element 22 of the double cylindrical member 24. To the lower casing 21b of the chamber 20 is attached the internal cylindrical element 23 of the double cylindrical member 24. Accordingly, the chamber 20 can be divided into two units by detaching the upper casing 21a from the lower casing 21b.

The bottom portion of the lower casing 21b is formed with a gas outlet 28 for discharging the process gas. The gas outlet 28 is connected to the exhaust pump 35 and to the scrubber 36 via an exhaust pipe.

In contrast to the structure shown in FIG. 1, the structure of the chamber shown in FIG. 10 has no space in which the flow of the process gas is stagnant, so that the deposition of reaction products generated on the wall surface of the chamber can be prevented effectively.

Figure 11:
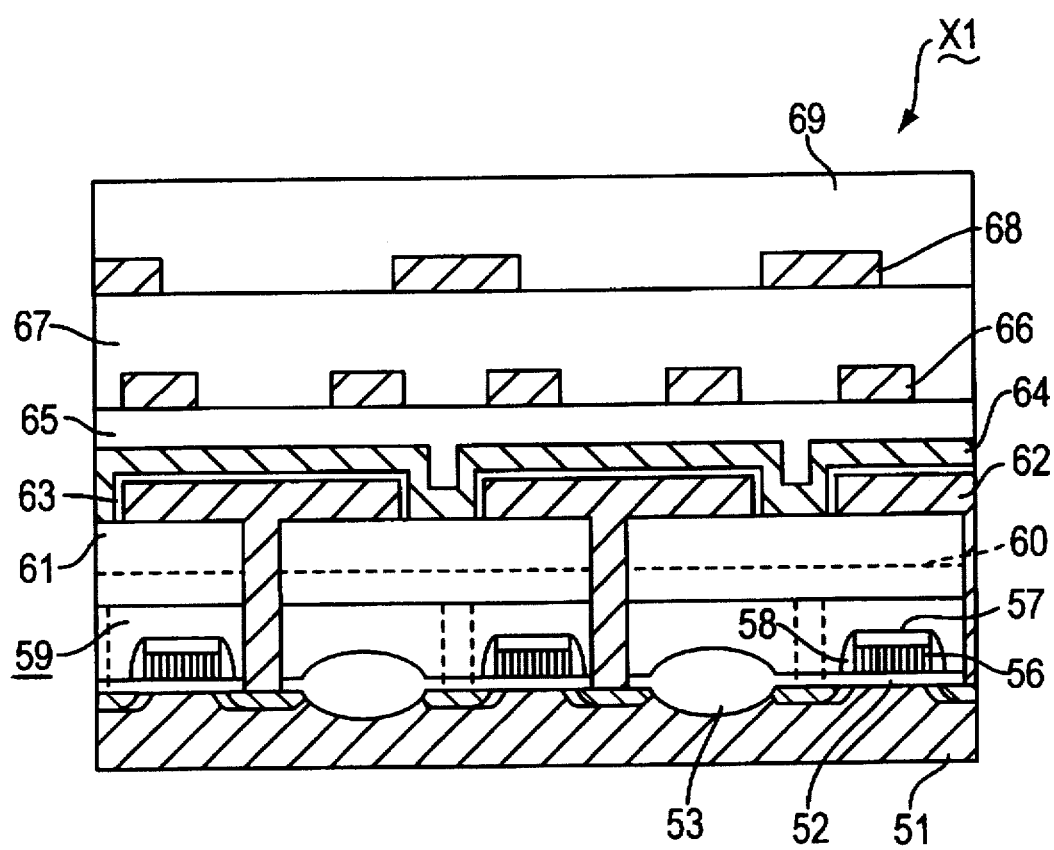
FIG. 11 is a cross-sectional view showing the structure of a DRAM memory cell according to the fourth embodiment.

Next, FIG. 11 shows the cross-sectional structure of a memory cell in a DRAM manufactured in the chamber with the above structure. As shown in the drawing, a gate oxide film 52 is formed on the main body of substrate 51, which is partially formed with isolations 53. In each of the active regions defined by the isolations 53 is provided a switching transistor, which comprises: a gate electrode 56 composed of a polysilicon film; an upper protective film 57 composed of a silicon dioxide film formed on the gate electrode 56; side walls 58 composed of silicon dioxide films which are formed on both sides of the gate electrode 56; LDDs (with no reference numeral) formed by introducing an impurity at low concentration into those portions of the main body of substrate 51 positioned below the ends of the gate electrode 56; and a high-concentration source/drain (with no reference numeral) formed by introducing an impurity at high concentration into those portions of the active region adjacent to the LDDs. Above the switching transistor is formed bit lines 60 via a first interlayer insulating film 59, on which are further provided a storage node 62, a capacitor insulating film 63, and a plate electrode 64 via a second interlayer insulating film 61. The above first interlayer insulating film 59 is composed of a silicon dioxide film doped with boron and phosphorus (BPSG film). The bit line 60 is composed of a two-layer film consisting of a polysilicon film and a WSi film (so-called polycide film). The second interlayer insulating film 61 is composed of a silicon dioxide film doped with boron and phosphorus (BPSG film). Each of the storage node 62 and plate electrode 64 is made of polysilicon. The capacitor insulating film 63 is composed of a multi-layer film consisting of a silicon nitride film and a silicon dioxide film. Above the foregoing elements is formed a first upper-layer interconnection 66 via a third interlayer insulating film 65. Above the first upper-layer interconnection 66 is further formed a second upper-layer interconnection 68 via a fourth interlayer insulating film 67. The above third interlayer insulating film 65 is composed of a BPSG film, while the fourth interlayer insulating film 67 is composed of a silicon dioxide film. Each of the upper-layer interconnections 66 and 68 is made of an Al alloy (e.g., Al containing about 5% of Si). On top of the foregoing elements is provided a passivation film 69 for preventing various impurities such as alkaline ions from entering into the semiconductor substrate X1. The passivation film 69 is composed of a multi-layer film consisting of a silicon nitride film and a silicon dioxide film.

Figure 12A:
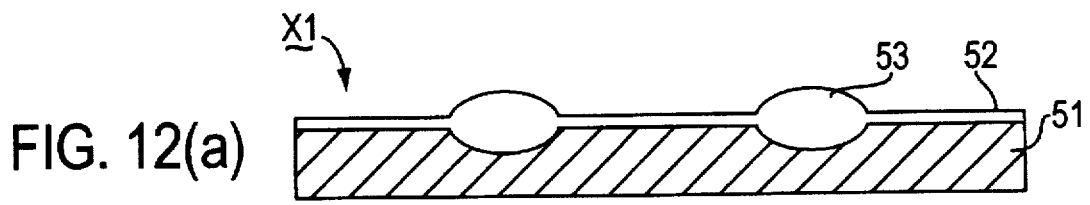
FIGS. 12(a) to 12(e) are cross-sectional views showing the transition of the structure of the semiconductor apparatus during the process of manufacturing the DRAM cell according to the fourth embodiment before the formation of a switching transistor.
Figure 12B:
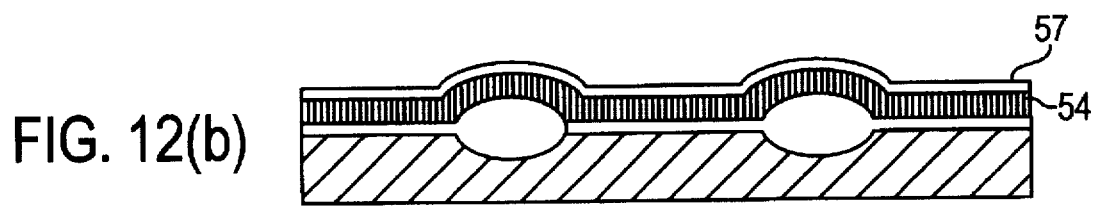
Figure 12C:
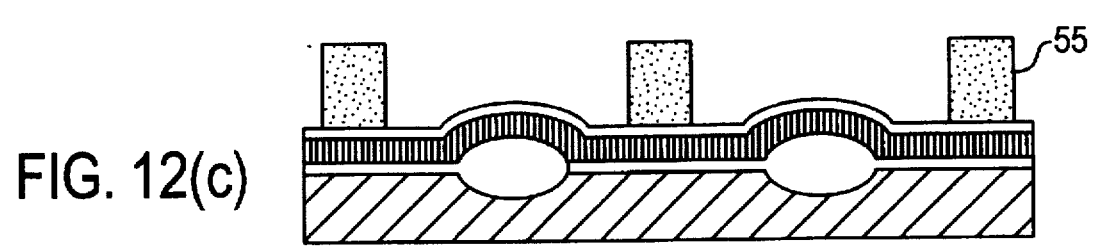

FIGS. 12(a) to 12(e) are cross sectional views showing the transition of a basic structure of the switching transistor during the formation process thereof in the process of manufacturing the DRAM cell with the structure described above. First, as shown in FIG. 12(a), the silicon dioxide film 52 is formed on the main body of substrate 51, followed by the formation of the isolations 53 by a well-known LOCOS method. Next, as shown in FIG. 12(b), the polysilicon film 54 and the silicon dioxide film 57 are deposited over the semiconductor substrate X1 by CVD. Next, as shown in FIG. 12(c), a resist is applied so as to form a resist mask 55 which covers only the regions in which the gate electrodes are to be formed.

Figure 12D:
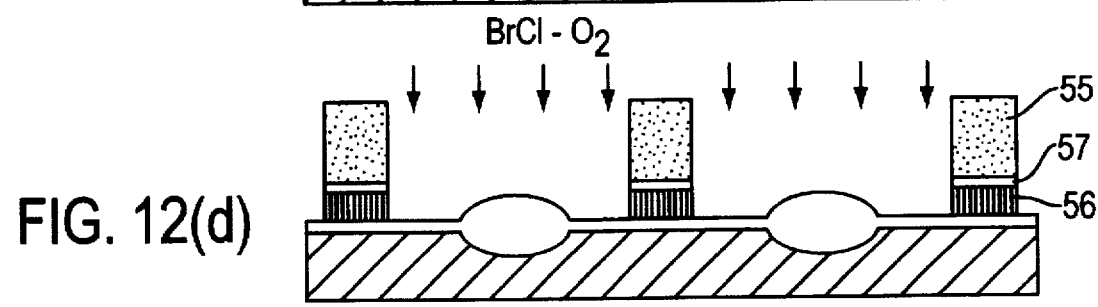
Figure 12E:
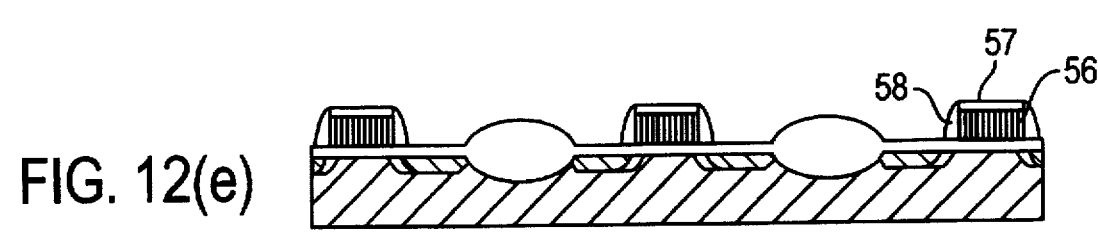

Then, as shown in FIG. 12(d), the polysilicon film 54 and the silicon dioxide film 57 are patterned. In this case, the present embodiment is characterized in that, in etching the polysilicon film 54, a BrCl gas is supplied from the first gas supplier 33, while an $O_2$ gas is supplied from the second gas supplier 34, thereby executing plasma etching. Instead of the pure BrCl gas, it is also possible to use a BrCl gas containing several percent of $ClF_3$ gas (or $BrF_3$ gas, $BrF_5$ gas, or a mixture thereof). The semiconductor substrate X1 shown in FIG. 12(e) was obtained by removing the resist mask 5 after patterning.

Thus, if a process gas containing the BrCl gas is used in performing plasma etching with respect to the above polysilicon film 54, those portions of the polysilicon film 54 corresponding to the openings in the resist mask 55 are selectively removed, thereby providing an excellent selectivity and substantially vertical edge profiles of the gate electrode 56. In general, it is known that the protection of the wall surface of the opening is required in order to perform highly anisotropic etching and thus realize satisfactory profiles of the gate electrode or the like. It is also known that the presence of Br in the deposited film is effective in protecting the wall surface. The effectiveness of Br can be attributed to the generation of a compound represented by the molecular formula $SiO_xBr_y$ at the surface of the semiconductor substrate in the presence of the plasma, which is deposited on the wall surface of the opening. Accordingly, HBr has been used conventionally as an etching gas, which is disadvantageous in that the film is also deposited on the wall surface of the reaction chamber. In this case, the deposition species can be considered to be a compound represented by $SiBr_x$ or $SiO_xBr_y$, each having low vapor pressure and poor volatility. However, since the present embodiment uses BrCl, which is an interhalogen compound, in the gas for etching, the protective film made of $SiO_xBr_y$ is formed on the wall surface of the opening formed by etching, while such a compound as $SiCl_4$ is generated through the chlorination of the deposition species at the wall surface of the reaction chamber, which is barely affected by the plasma. Since such a compound is highly volatile, the deposition of the reaction products on the wall surface of the reaction chamber and the like can be suppressed.

After patterning the above gate electrode 56, the upper protective film 57 and side walls 58 of the above gate electrode 56 are formed and impurity ions are implanted so as to form the high-concentration source/drain (with no reference numeral), the LDD (with no reference numeral), and the like in the main body of substrate 51, though the detailed description thereof is omitted here. Through the above process, the basic structure of the switching transistor is formed.

Figure 13A:
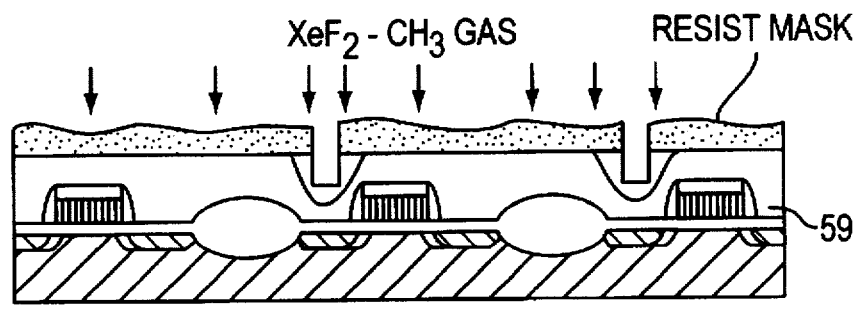
FIGS. 13(a) to 13(d) are cross-sectional views showing the transition of the structure of the semiconductor apparatus during the process of manufacturing the DRAM cell according to the fourth embodiment after the formation of the switching transistor.

FIGS. 13(a) to 13(d) are cross-sectional views showing the semiconductor substrate X1 in the manufacturing process thereof after the formation of the switching transistor. First, as shown in FIG. 13(a), the first interlayer insulating film 59 composed of a silicon dioxide film is deposited on the entire surface of the semiconductor substrate X1 by plasma CVD. In this step, the above first gas supplier 33 supplies a silane gas as the main gas, while the second gas supplier 34 supplies the $ClF_3$ gas as an additional gas. The silane gas supplied into the above chamber 20 is turned into a plasma at the surface of the semiconductor substrate X1, so that the silicon dioxide film is grown by the reaction between silicon atoms liberated from silane molecules and oxygen. On the other hand, since the influence of the plasma on the wall surface of the reaction chamber is extremely small, the reaction represented by the following reaction formula proceeds in the presence of the $ClF_3$ gas, which is an interhalogen compound having extremely low activation energy in the reaction with the deposition species:

$$3Si+6O+4ClF_3 \rightarrow 3SiF_4+3O_2+2Cl_2. \text{ (on chamber wall)}$$

Each of the products in the above reaction formula is a volatile material. As a result, the deposition of the reaction products on the wall surface of the reaction chamber can be suppressed effectively. As the process gas, it is also possible to use a $XeF_2$ gas or a $F_2$ gas diluted with a $NF_3$ gas. In this case, since there is no possibility of Cl atoms entering into the silicon dioxide film, which might have occurred in the case of using the $ClF_3$ gas, the reliability of the semiconductor apparatus is increased.

Next, as shown in FIG. 13(a), contact holes are formed in the first interlayer insulating film 59 in order to form bit-line contacts. Since the portions in which the bit-line contacts are to be formed are different in cross section from the portions shown in the drawing, they are partially indicated by broken lines (the same shall apply in FIG. 13(b)). In this step, the first gas supplier 33 supplies a $CHF_3$ gas (or a $CH_2F_2$, a $CH_3F$ gas, a $CH_4+H_2$ gas, or a mixture thereof), while the second gas supplier 34 supplies a $XeF_2$ gas (or the $F_2$ gas diluted with the $NF_3$ gas), thereby executing plasma etching. Thus, the first interlayer insulation film 59 composed of the silicon dioxide film and the oxide film immediately above the main body of substrate 51 can be removed, while suppressing the deposition of the reaction products on the inner surface of the chamber 20 and the like.

Figure 13B:
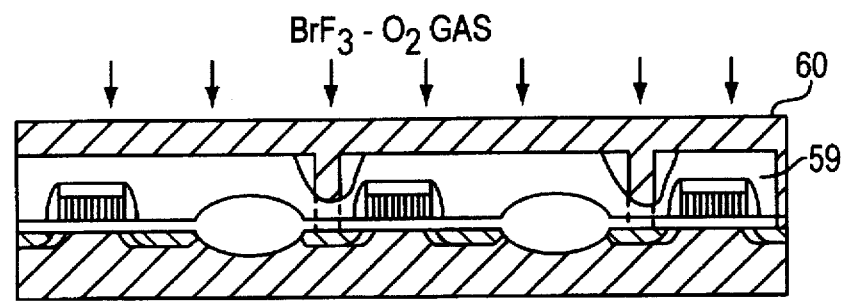

Next, as shown in FIG. 13(b), a so-called polycide film is formed by sequentially depositing polysilicon and WSi (tungsten silicide), which is shown as a single layer in the drawing for clarity, and then the resulting polycide film is patterned so as to form the bit lines 60. In patterning the upper-layer WSi film of the polycide film, the first gas supplier 33 supplies a $BrF_3$ gas (or $BrF_5$ gas), while the second gas supplier 34 supplies the $O_2$ gas, thereby executing plasma etching. When the etching of the silicide film is completed, the supply of the $BrF_3$—$O_2$ gas is switched to the supply of the BrCl—$O_2$ gas so as to etch the polysilicon film. In general, it is known that F atoms are required in order to etch a silicide film composed of WSi or the like. Accordingly, a mixture gas of HBr—$SF_6$—$O_2$ has been used conventionally. However, the volatility of the deposition species resulting from etching using the above gas is also low, similarly to the case of using the HBr gas for the polysilicon film, so that the reaction products are deposited on the wall surface of the reaction chamber and the like. If the $BrF_3$—$O_2$ gas or $BrF_5$—$O_2$ gas is used as in the present embodiment, a protective film of a non-volatile material such as $SiO_xBr_y$ is formed on the surface of the semiconductor substrate so that excellent profiles are imparted to the opening, while a volatile material (e.g., $WF_x$ such as $WF_6$ or $SiF_4$) is generated on the wall surface of the reaction chamber which is barely influenced by the plasma so that the deposition of the reaction products on the wall surface of the reaction chamber is suppressed. Consequently, the deposition of the reaction products on the wall surface of the reaction chamber and the like can be prevented, while sustaining excellent selectivity and excellent profiles of the bit lines. Moreover, it is also possible to expect a reduction in the types of gases to be used.

Although the above embodiment has described the case of etching the polycide film, it will be appreciated that the present invention is also applicable to the case of etching a multi-layer film consisting of a silicon dioxide film and a silicide film such as a WSi film simply formed thereon. Instead of the WSi film, a $TiSi_2$ film, $CoSi_2$ film, $NiSi_2$ film, or the like may be used as the silicide film. Even when a BrCl—$O_2$ gas is used as the etching gas, excellent profiles can be imparted to the opening while achieving an excellent effect of suppressing the deposition of the reaction products on the wall surface of the reaction chamber and the like. In the case where the silicide film, instead of the polycide film, is formed on the silicon dioxide film, the use of the BrCl gas particularly increases the selectivity and hence protects the underlying silicon dioxide film more satisfactorily.

Figure 13C:
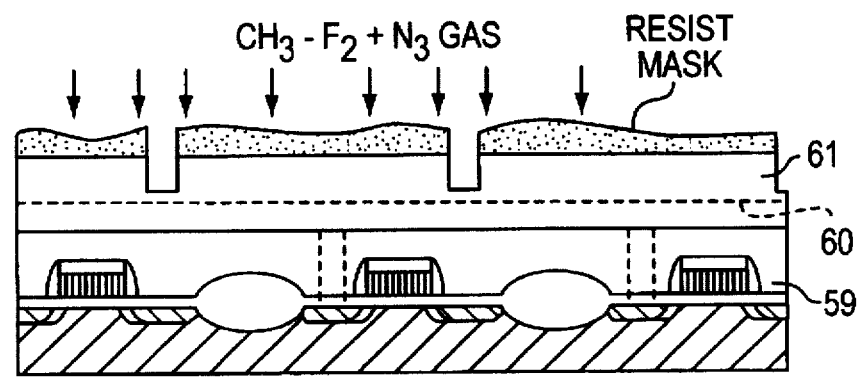

Next, as shown in FIG. 13(c), the second interlayer insulating film 61 composed of the BPSG film is deposited on the entire surface of the semiconductor substrate X1. In this case, the first gas supplier 33 supplies a mixture gas of monosilane, phosphine, and diborane as the main gas, while the second gas supplier 34 supplies the $ClF_3$ gas as the additional gas, thereby executing plasma CVD. Thus, the deposition of the reaction products on the wall surface of the reaction chamber can be suppressed, while forming the BPSG film. After that, contact holes for the storage nodes 62 are formed in the second interlayer insulating film 61. In this step, the first gas supplier 33 supplies the $F_2$ gas diluted with $NF_3$, while the second gas supplier 34 supplies the $O_2$ gas, thereby executing plasma etching. In this manner, the same effects as achieved by the $XeF_2$ gas used in selectively etching the above first interlayer insulating film 59 can be achieved.

Figure 13D:
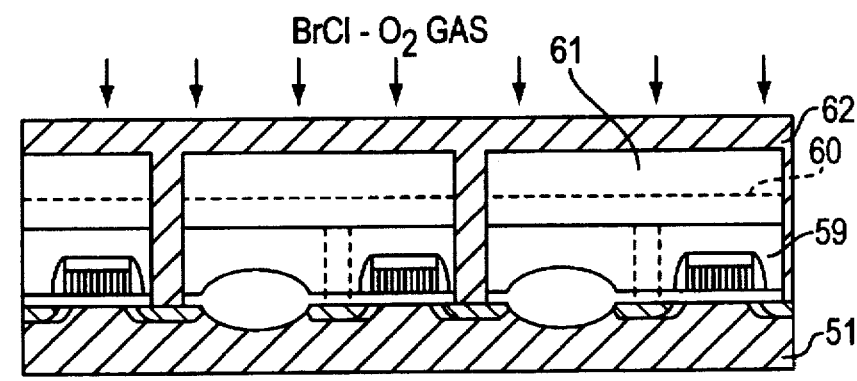

Next, as shown in FIG. 13(d), the polysilicon film is deposited, followed by the patterning thereof, thereby forming the storage nodes 82. In patterning the polysilicon film, the first gas supplier 33 supplies the BrCl gas, while the second gas supplier 34 supplies the $O_2$ gas, thereby executing plasma etching. In general, a considerably thick polysilicon film is used to constitute storage nodes in a DRAM memory cell so that large capacitance is surely obtained. Consequently, in patterning the polysilicon film by a conventional plasma etching method, large amounts of reaction products are deposited on the wall surface of the reaction chamber. On the other hand, the present embodiment can effectively suppress the deposition of the reaction products on the wall surface of the reaction chamber by the cleaning effect using halogens from BrCl in the deposition species as described above.

Subsequently, the capacitor insulating film 63 and the plate electrode 64 are sequentially formed on the storage node 62 and the third interlayer insulating film 65 is deposited thereon, though the drawing of the above film formation process is omitted there. Even in the case of depositing these films or patterning the films by plasma etching, the above-mentioned interhalogen compound gas can also be supplied as the additional gas.

The first upper-layer interconnection 66 and second upper-layer interconnection 68 further formed on the third interlayer insulating film 65 are made of an Al alloy. In patterning the upper-layer interconnections 66 and 68, the first gas supplier 33 supplies the BrCl gas, while the second gas supplier 34 supplies the $O_2$ gas, thereby executing plasma etching. In this step, a protective film made of a non-volatile material is formed on the surface of the semiconductor substrate, while the deposition species is turned into a volatile material (e.g., $AlCl_3$) at the wall surface of the reaction chamber which is barely influenced by the plasma, so that the deposition of the reaction products on the wall surface of the reaction chamber and the like can be suppressed. Moreover, since F atoms do not exist in the process gas accordingly, the growth of $AlF_3$ in an angular shape from the semiconductor substrate during plasma etching can be avoided, so that remarkable effects can be achieved in conjunction with the above cleaning effect.

Figure 14:
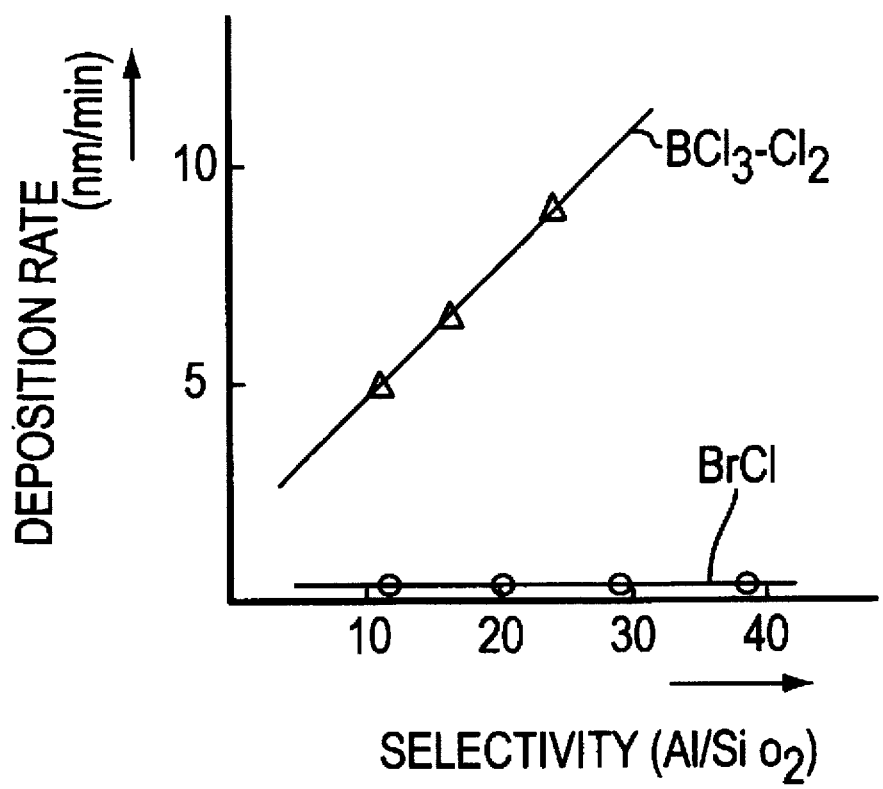
FIG. 14 is a view showing for comparison different relationships between the selectivity and the deposition rate of reaction products in the case of using a BrCl gas and in the case of using a $BCl_3$—$Cl_2$ gas.

FIG. 14 shows different relationships between the selectivity of Al to $SiO_2$ in etching and the rate (nm/min) at which reaction products are deposited on the wall surface of the reaction chamber. As shown in the drawing, with the mixture gas of $BCl_3$—$Cl_2$ conventionally used, the rate at which the reaction products are deposited on the wall surface of the chamber increases as the selectivity increases, so that much labor is required in order to frequently clean the inside of the chamber, resulting in an extremely small number of wafers that can be processed sequentially. In the case of using the BrCl gas, on the other hand, the rate at which the reaction products are deposited on the wall surface of the reaction chamber is extremely low even when the selectivity increases. Consequently, an improvement in selectivity and the suppression of the deposition of the reaction products on the inner surface of the chamber, which are contradictory to each other, can be implemented at the same time.

In depositing the top passivation film 69, a mixture gas of dichlorosilane and ammonia is supplied as the main gas, while the $ClF_3$ gas is supplied as the additional gas, thereby executing plasma CVD. Consequently, the deposition of the reaction products on the wall surface of the reaction chamber can be suppressed advantageously in forming a thick silicon nitride film with an excellent characteristic of preventing the entrance of alkaline ions.

Thus, in the present embodiment, a gas which is highly reactive in the state of non-plasma with the deposition species, such as an interhalogen compound gas or $XeF_2$, is supplied as the process gas in depositing or patterning an insulating film such as a silicon dioxide film or a silicon nitride film or in depositing or patterning a conductive film. In this case, a non-volatile film is formed on the surface of the semiconductor substrate around which the process gas is in the state of plasma. In the case of CVD, the non-volatile film is a silicon dioxide film or the like to be formed on the semiconductor substrate. In the case of etching, the non-volatile film is a protective film for protecting the side walls of an opening. In the state of non-plasma, on the other hand, such a gas preferentially reacts with the deposition species to generate volatile compounds, so that these materials are discharged without being deposited on the wall surface of the reaction chamber, piping, and the like. Consequently, the deposition of the reaction products on the inner surface of the chamber can effectively be suppressed, thereby saving a great deal of labor required conventionally to remove deposits in the chamber. Moreover, the time period during which operation can be performed continuously is increased considerably, which contributes to a significant reduction in the manufacturing cost of a semiconductor apparatus.

Figure 15:
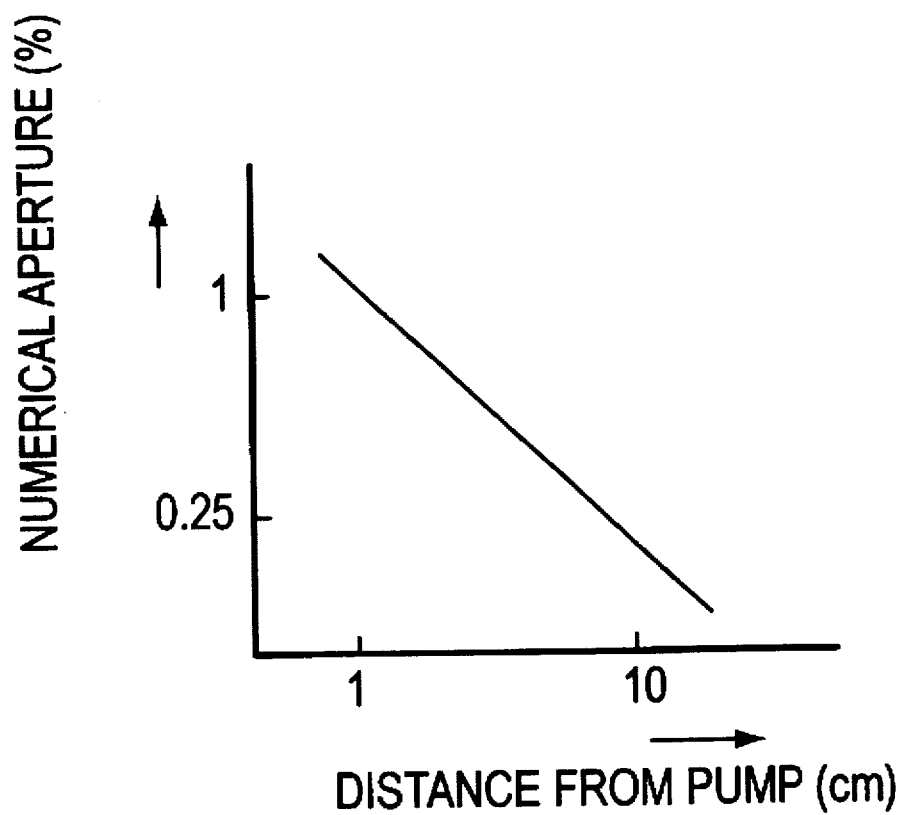
FIG. 15 is a view showing the relationship between the aperture of a minute hole in an internal cylindrical element and the distance between the minute hole and a pump.

FIG. 15 shows the optimum relationship between the distance from the pump 35 and the numerical aperture of each of the minute holes 26. As the distance from the pump 35 increases, the numerical aperture of each of the minute holes 26 is reduced. For example, if minute holes each having a diameter of 1 mm are provided at intervals of 10 mm, the numerical aperture becomes 1%. If minute holes each having a diameter of 0.5 mm are provided at intervals of 10 mm, the numerical aperture of each of the minute holes becomes 0.25%. Thus, by varying the numerical aperture of each of the minute holes, the velocity of the gas flowing through the minute holes becomes more uniform.

EXAMPLE 5

Figure 16:
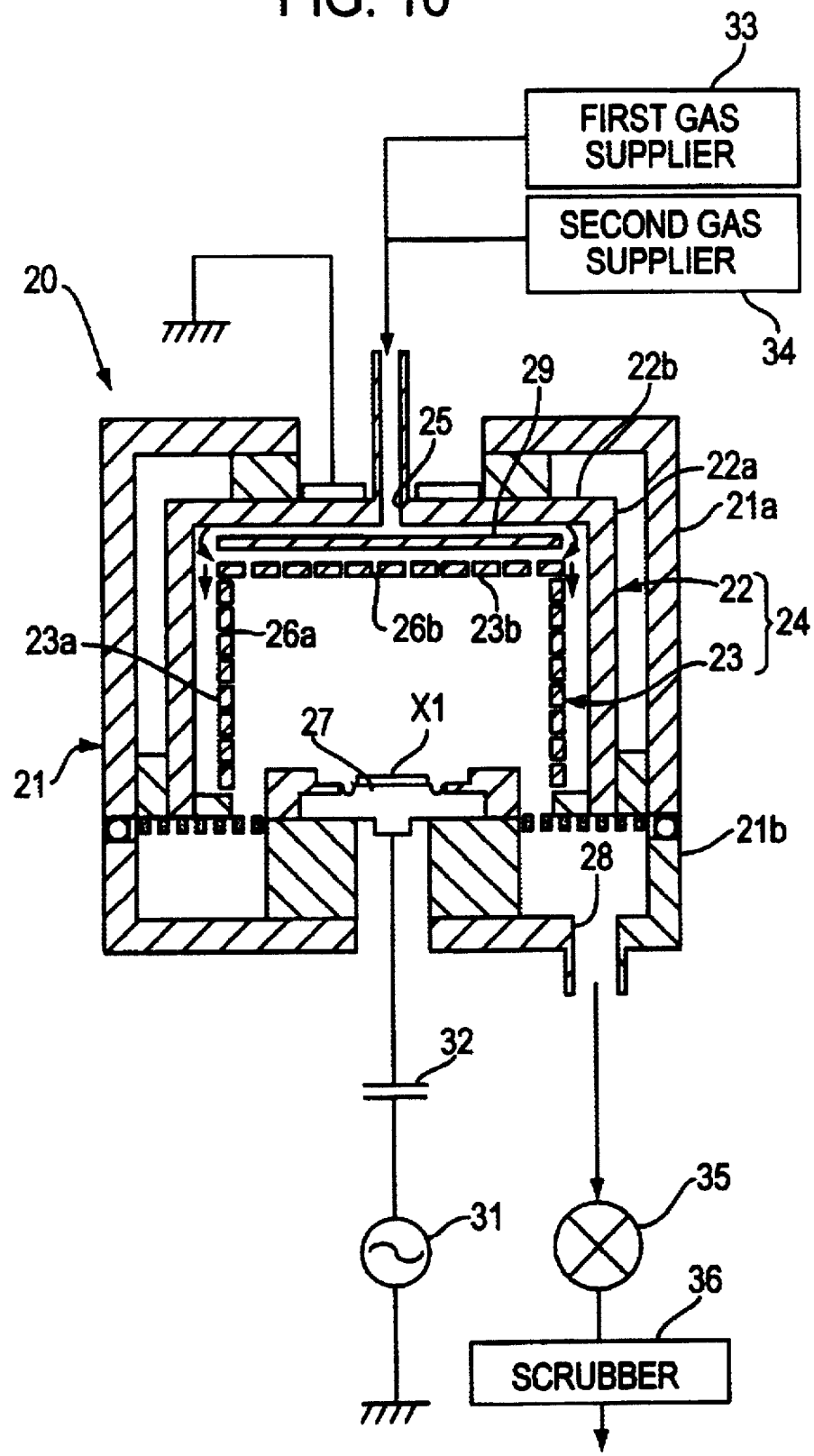

Next, a description will be given to a fifth embodiment. FIG. 16 shows the structure of the apparatus for processing a semiconductor substrate according to the fifth embodiment. As shown in the drawing, the structure of the chamber 20 in the present embodiment is basically the same as that of the chamber 20 in the above fourth embodiment shown in FIG. 10, except that a disk-shaped resistance member 29 is provided between end plate 23b of the internal cylindrical element 23 and the end plate 22b of the external cylindrical element 22 in the present embodiment. That is, the resistance member 29 gives resistance to the flow of the process gas which tends to flow through the minute holes 26b formed in the end plate 23b of the internal cylindrical element 23. Also in the present embodiment, the upper electrode provided in the end plate 23b of the inner cylindrical element 23 is made of SUS or Al so that a coating layer of carbon is formed thereon.

Thus, with the provision of the resistance member 29, the velocity of the process gas through the minute holes 26a in the end plate 23b can be kept sufficiently high even when the minute hole 26a formed in the cylinder 23a of the internal cylindrical element 23 and the minute hole 26b in the end plate are formed to have the same diameter. Accordingly, the chamber can be manufactured at lower cost.

If the upper electrode is made of Al and coated with alumite as in the above fourth embodiment, however, there is a possibility that Al ions are sputtered and deposited on the semiconductor substrate, thereby causing adverse effects such as leakage current in the semiconductor apparatus. To prevent the adverse effects, an upper electrode made of Si has conventionally been used. On the other hand, it is known that, if a carbon electrode is used in conventional etching, the uniformity of etching deteriorates due to the reaction products deposited on the electrode. As a result, although the selectivity of dry etching is high, the characteristics of etching tend to vary with the passage of time or deteriorate because of a high deposition rate of the products.

On the other hand, with the interhalogen compound gas, $XeF_2$ gas, or the like used in the present invention, etching proceeds at the Si electrode by using the interhalogen compound from the Si electrode itself, so that the life time of the electrode is shortened. However, if carbon is used to constitute at least the surface of the upper electrode, excellent uniformity of etching, high selectivity, and long life time of the electrode can be implemented. In the case of plasma etching in the present embodiment, therefore, the function of properly forming the protective film on the surface of the opening and excellent uniformity of etching can be obtained, while maintaining high selectivity. On the other hand, since the deposition of the reaction products on the wall surface of the reaction chamber and the like can be suppressed due to the generation of the volatile material in the state of non-plasma, the same effects as obtained in the above fourth embodiment can be obtained as well.

Figure 17A:
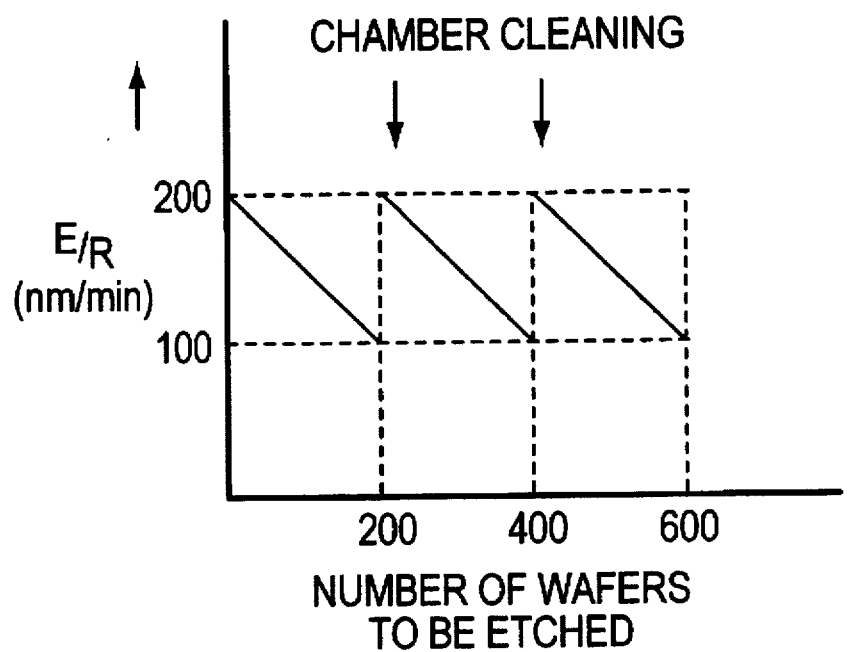
FIG. 17(a) is a view showing a throughput according to a conventional method.
Figure 17B:
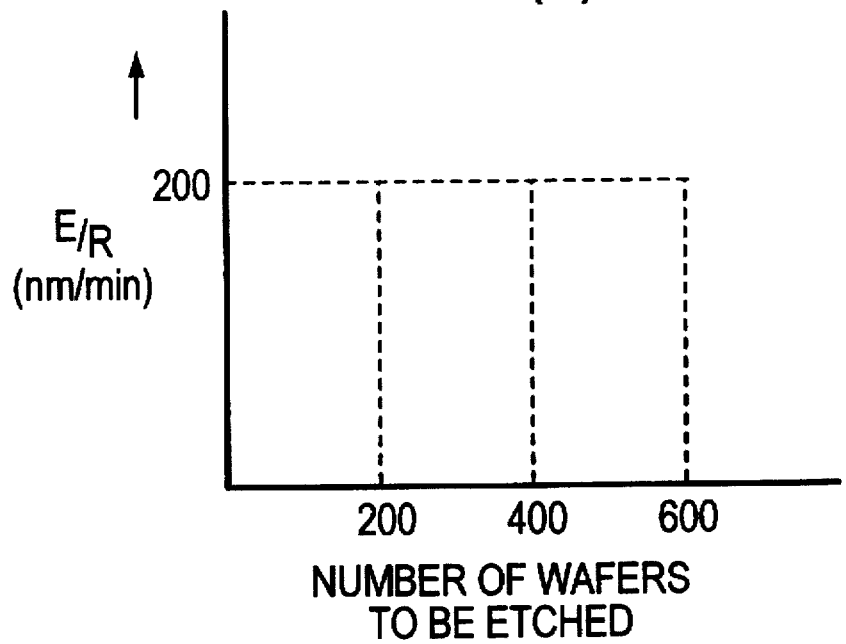
FIG. 17(b) is a view showing a throughput according to the present invention.

Next, a description will be given to the effect of improving a throughput achieved by the present invention. FIGS. 17(a) and 17(b) show the transitions of the etching rate (E/R) with respect to the number of semiconductor wafers subjected to dry etching: FIG. 17(a) shows the case where conventional dry etching was conducted without using an interhalogen compound gas or the like; and FIG. 17(b) shows the case where dry etching was conducted using the gas according to the present invention. In the case of conducting conventional dry etching using only an anisotropic etchant gas as shown in FIG. 17(a), the etching rate is immediately lowered due to the deposition of the reaction products on the wall surface of the reaction chamber so that chamber cleaning is required at time intervals of 24 to 48 hours. On the other hand, in the case of conducting dry etching using the gas according to the present invention as shown in FIG. 17(b), the etching rate is not substantially lowered because the reaction products are hardly deposited on the wall surface of the reaction chamber, so that it becomes possible to perform continuous operation over a long period of time.

EXAMPLE 6

Figure 18:
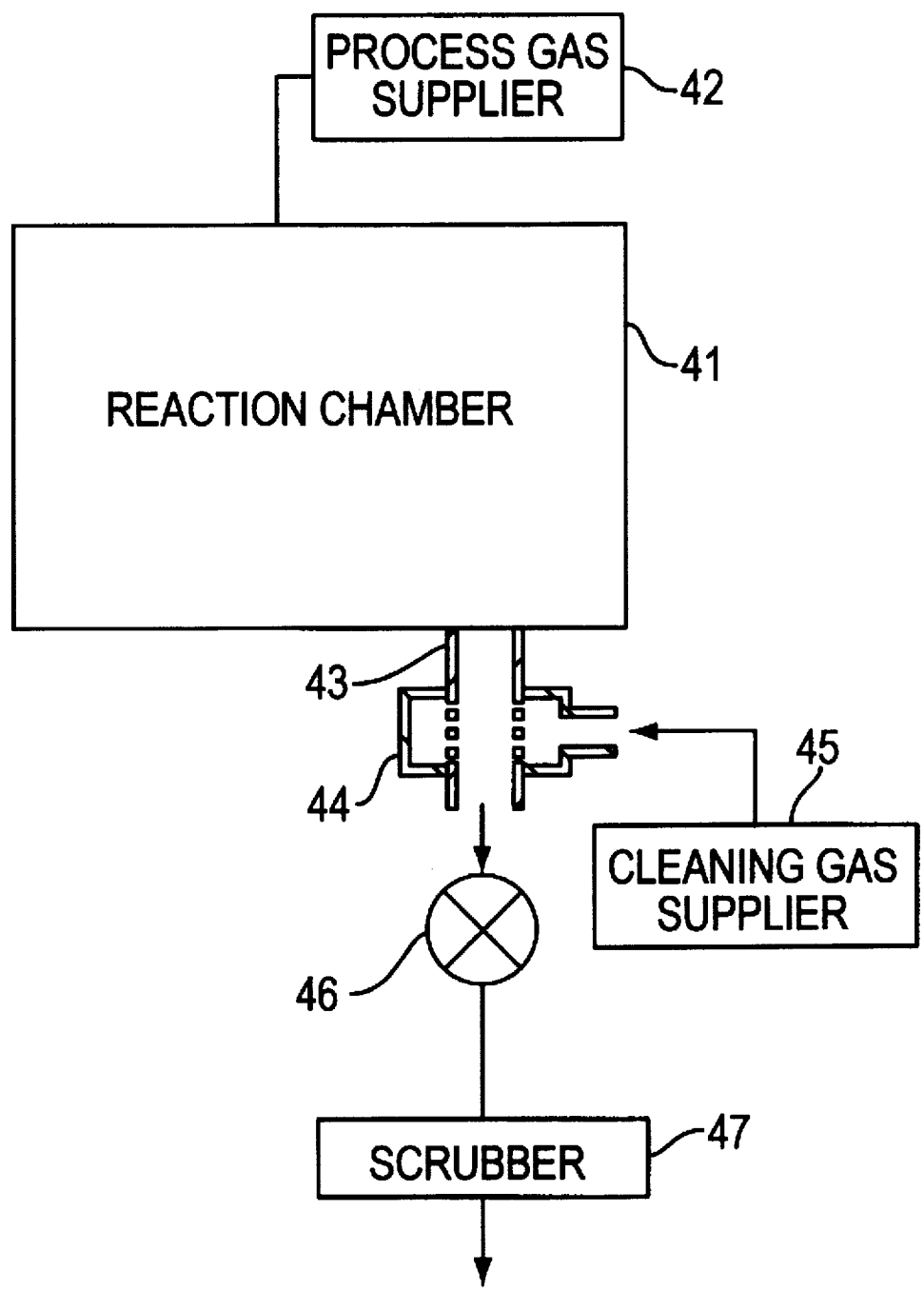
FIG. 18 is a cross-sectional view partially showing the structure of an apparatus for processing a semiconductor substrate according to a fifth embodiment.

Next, a description will be given to a sixth embodiment. As shown in FIG. 18, in the apparatus for processing a semiconductor substrate according to the present embodiment, there are disposed a reaction chamber 41, a process gas supplier 42 for supplying the process gas to the reaction chamber 41, an exhaust pipe 43 for discharging the gas out of the reaction chamber 41, a pump 46 as a discharging means for adsorbing the gas from the reaction chamber 41, and a scrubber 47. The present embodiment is characterized in that a large number of minute holes are formed in that portion of the above exhaust pipe 43 positioned immediately below the reaction chamber 41. To the portion formed with the minute holes is attached a cleaning member 44 for introducing a cleaning gas into the exhaust pipe 43. That is, the cleaning gas such as the interhalogen compound gas (e.g., BrCl gas or ClF$_3$ gas) is supplied from the cleaning gas supplier 45 so that the deposition species generated in the reaction chamber 41 is turned into a volatile material, thereby suppressing the deposition of the reaction products on the wall surface of the exhaust pipe.

Consequently, the present embodiment can suppress the deposition of the reaction products not only on the inner surface of the reaction chamber but also on the inner surface of the exhaust pipe 43, the cleaning of which has been conventionally impossible.

It is also possible to attach the above cleaning member 44 to the exhaust pipe in the chamber 20 of the above fourth or fifth embodiment. In this case, a reduction in the types of gases to be used can be expected by using, as the cleaning gas, the interhalogen compound gas, XeF$_3$ gas, or the like contained in the process gas.

Although each of the above embodiments has described an example using a parallel plate RIE system as a plasma generator, the present invention is not limited to these embodiments. As the plasma generator, each of the helicon wave excited plasma (HWP) system, surface wave excited plasma system, inductively coupled plasma (ICP) system, electron cyclotron resonance plasma system, or the like can be used.

Next, a description will be given to the characteristics of an interhalogen compound gas which exerts a remarkable cleaning effect to be achieved by the present invention.

Figure 19:
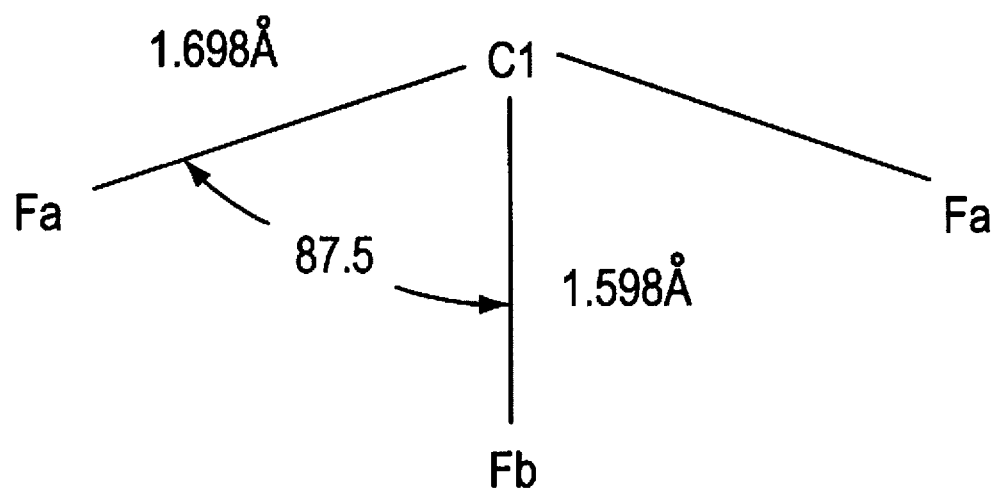
FIG. 19 is a view showing the structure of a $ClF_3$ molecule.

Of interhalogen compound gases, fluoride Gases include ClF, ClF$_3$, ClF$_5$, BrF, BrF$_3$, BrF$_5$, and BrF$_7$. These gases are used in rockets or in nuclear reactors as highly-reactive fluorinating agents. As shown in the above chemical formula, these gases have the function of etching silicon in the state of non-plasma. FIG. 19 shows the structure of the ClF$_3$ gas. The ClF$_3$ gas is decomposed in accordance with the following formula:

$$ClF_3 \rightarrow ClF + F_2.$$

The reaction energy $\Delta E$ ($=E_{ClF}+E_{F2}-E_{ClF3}$) accompanying the decomposition is 27.0 Kcal/mol.

On the other hand, it is known that the CF$_4$ gas used in plasma etching is decomposed into the CF$_2$ gas and two F radicals so as to cause the effect of etching silicon, silicon oxide or the like. The reaction product CF$_2$ is polymerized, resulting in a polymer, which is deposited on the wall surfaces of the contact holes and on the wall surface of the reaction chamber. Here, the cleaning effect achieved by a reactive gas X such as the above interhalogen compound gas is represented by the following formula:

$$CF_2^* + X \rightarrow CF_4 + Y \text{ (Y is a volatile reaction product).}$$

Hence, the difference in reaction energy $\Delta E$ can be represented by the following formula:

$$\Delta E = +(E_{CF4}+E_y)-(E_{CF2}+E_x).$$

Figure 20:
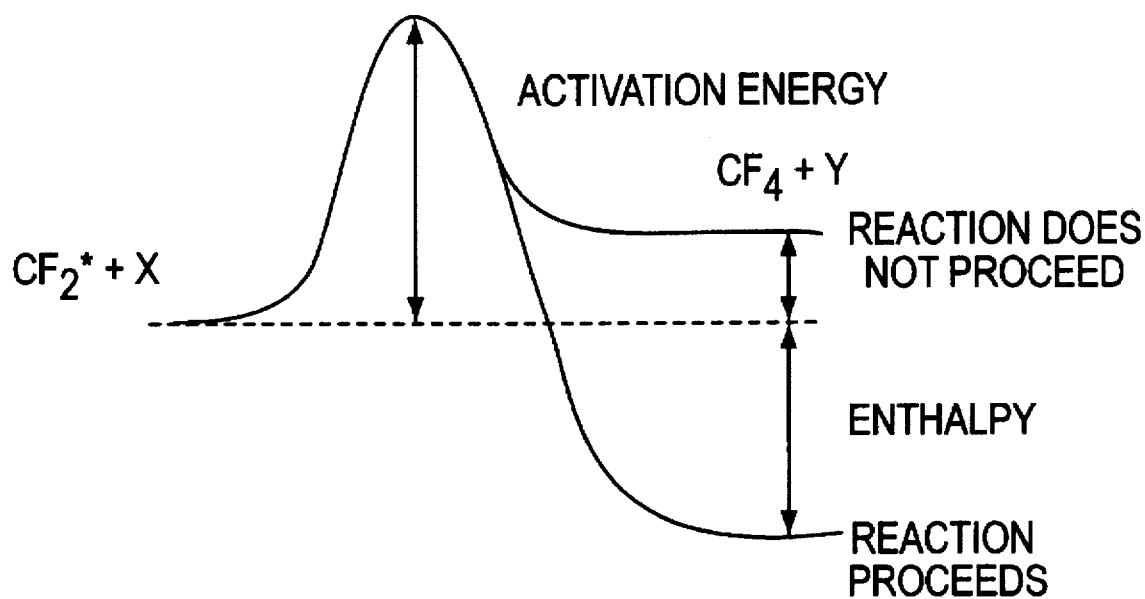
FIG. 20 is a view showing the state of activation energy between a mixture of $CF_2$ radicals and a reactive gas and a mixture of a $CF_4$ gas and a volatile reaction product.
Figure 21:
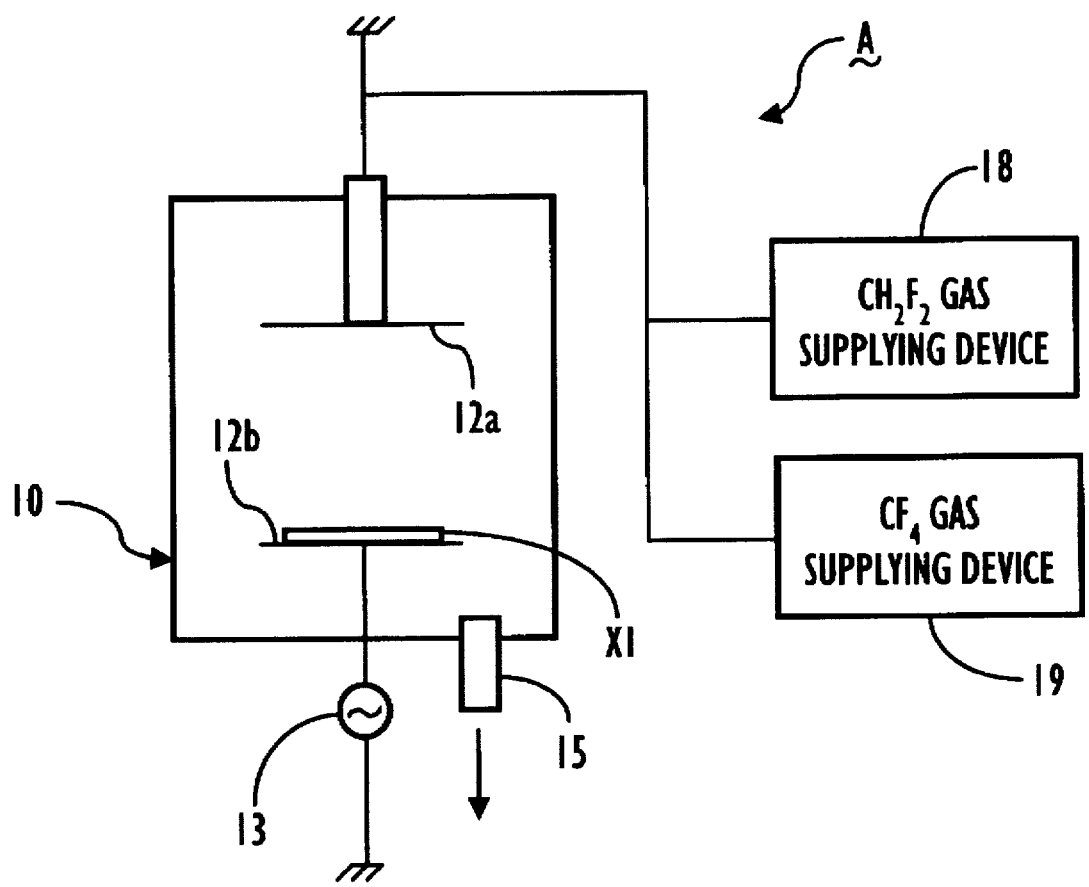
FIG. 21 is a view diagrammatically showing the structure of a conventional apparatus for etching a silicon-nitride film.
Figure 22A:
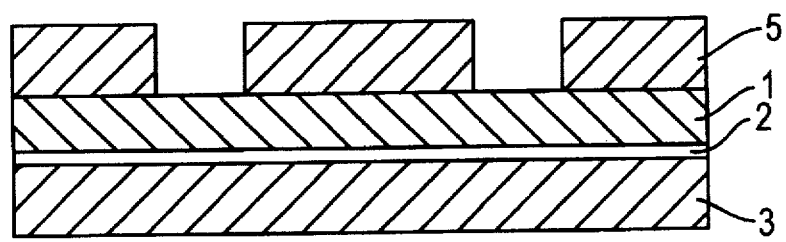
FIG. 22(a) is a cross-sectional view showing a silicon substrate when a photoresist film is patterned in a conventional LOCOS forming process.
Figure 22B:
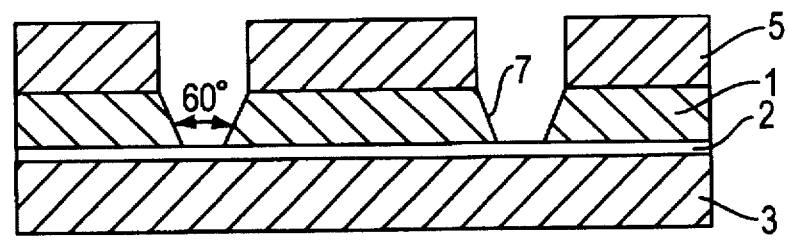
FIG. 22(b) is a cross-sectional view showing the silicon substrate when a silicon-nitride film is etched selectively.
Figure 22C:
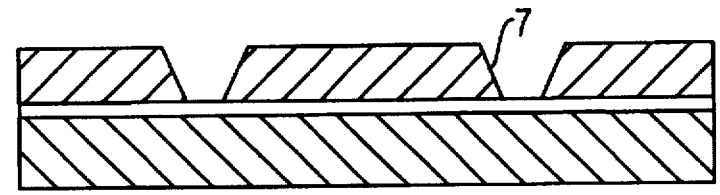
FIG. 22(c) is a cross-sectional view showing the silicon substrate when the photoresist film is removed.
Figure 22D:
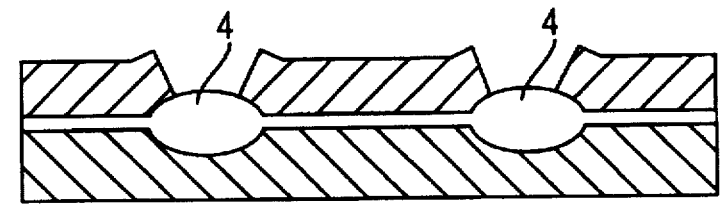
FIG. 22(d) is a cross-sectional view showing the silicon substrate on which the LOCOS is formed.
Figure 22E:
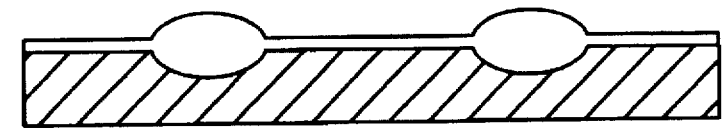
FIG. 22(e) is a cross-sectional view showing the silicon substrate when the silicon-nitride film serving as a mask is removed.

As shown in FIG. 20, if the energy difference $\Delta E$ is negative, the above reaction formula proceeds from left to right so as to produce non-volatile reaction products, thus preventing the deposition of the reaction products on the inner surface of the reaction chamber and the like.

The following Table 1 shows the reaction products Y other than CF$_4$ obtained from various reactive gas species X in plasma etching using the CF$_4$ gas and the energy differences $\Delta E$ (Kcal/mol). It will be appreciated from the table that the cleaning effects of the interhalogen compound gases and F$_2$ gas are extremely high.

TABLE 1

| REACTIVE GAS SPECIES | REACTION PRODUCT OTHER THAN CF$_4$ | $\Delta E$ (Kcal/mol.) |
|---|---|---|
| F$_2$ | NONE | −197.8 |
| ClF$_3$ | ClF | −170.7 |
| NF$_3$ | NF$_2$ | −106.3 |
| SF$_6$ | SF$_4$ | −77.6 |
| HF | H$_2$ | −51.3 |

We claim:
1. A dry etching method comprising the steps of:
   disposing in a reaction chamber a semiconductor substrate including a film;
   introducing into the reaction chamber a process gas comprising a gas with the function of anisotropic etching, said process gas comprising at least an interhalogen compound gas and a carbon fluoride gas, and at least either of a XeF$_2$ gas and a diluted F$_2$ gas, said process gas exerting, in the state of plasma, the effects of etching said film and depositing reaction products on the wall surface of an opening formed by etching, while generating, in the state of non-plasma and with activation energy lower than a specified level, a volatile material from a deposition species generated in said etching so as to contribute to the suppression of film formation; and removing at least a part of said film by turning the process gas into a plasma in the vicinity of the semiconductor substrate in said reaction chamber.

2. A dry etching method according to claim 1, wherein a $ClF_3$ gas is used as said interhalogen compound gas and at least one of a $CHF_3$ gas, a $CH_2F_2$ gas, a $C_3F_6$ gas, and a $C_4F_8$ gas is used as said carbon fluoride gas.

3. A dry etching method according to claim 1, wherein an inert gas in addition to the carbon fluoride gas and the interhalogen compound gas is mixed into said process gas.

4. A dry etching method according to claim 1, wherein the supply of the process gas is halted immediately before said process of removing the film is completed and then the process of removing the film is continued by turning the carbon fluoride gas into a plasma.

5. A dry etching method according to claim 1, wherein the amount of the interhalogen compound gas being supplied is gradually decreased as said process of removing the film approaches the completion.

6. A dry etching method according to claim 1, wherein the generation of the plasma is halted after said process of removing the film is completed so that at least the interhalogen compound gas remains in the reaction chamber.

7. A dry etching method comprising the steps of:

disposing in a reaction chamber a semiconductor substrate formed with an insulating film comprising a silicon element as its component;

introducing into the reaction chamber a process gas comprising containing a carbon-containing gas and at least either of a $XeF_2$ gas and a diluted $F_2$ gas; and selectively removing at least a part of said insulating film on the semiconductor substrate by turning the process gas into a plasma in the vicinity of the substrate in said reaction chamber.

8. A dry etching method according to claim 7, wherein the diluted $F_2$ gas is diluted with a $NF_3$ gas.

9. A dry etching method according to claim 7, wherein the carbon-containing gas is at least one of a $CHF_3$ gas, a $CH_2F_2$ gas, a $CH_3F$ gas, a $CH_4+H_2$ gas, or a mixture thereof.

10. A dry etching method according to claim 7, wherein the process gas contains a $F_2$ gas and a $O_2$ gas.

11. A dry etching method according to claim 7, wherein the insulating film is at least one of a silicon oxide film or a silicon nitride film.

12. A dry etching method comprising the steps of:

disposing in a reaction chamber a semiconductor substrate including a polysilicon film;

introducing into the reaction chamber a process gas comprising a gas with the function of anisotropic etching, said process gas comprising at least an interhalogen compound gas which includes at least a BrCl gas, said process gas further comprising at least either of a $XeF_2$ gas and a diluted $F_2$ gas said process gas exerting, in the state of plasma, the effects of etching said film and depositing reaction products on the wall surface of an opening formed by etching, while generating, in the state of non-plasma and with activation energy lower than a specified level, a volatile material from a deposition species generated in said etching so as to contribute to the suppression of film formation; and removing at least a part of said film by turning the process gas into a plasma in the vicinity of the semiconductor substrate in said reaction chamber.

13. A dry etching method comprising the steps of:

disposing in a reaction chamber a semiconductor substrate including a metal film comprising Al as its main component;

introducing into the reaction chamber a process gas comprising a gas with the function of anisotropic etching, said process gas comprising at least an interhalogen compound gas which is a BrCl gas, said process gas further comprising at least either of a $XeF_2$ gas and a diluted $F_2$ gas, said process gas exerting, in the state of plasma, the effects of etching said film and depositing reaction products on the wall surface of an opening formed by etching, while generating, in the state of non-plasma and with activation energy lower than a specified level, a volatile material from a deposition species generated in said etching so as to contribute to the suppression of film formation; and removing at least a part of said film by turning the process gas into a plasma in the vicinity of the semiconductor substrate in said reaction chamber.

14. A dry etching method comprising the steps of:

disposing in a reaction chamber a semiconductor substrate including a silicide film;

introducing into the reaction chamber a process gas comprising a gas with the function of anisotropic etching, said process gas comprising at least an interhalogen compound gas which is at least either of a $BrF_3$ gas and a $BrF_5$ gas, said process gas further comprising at least either of a $XeF_2$ gas and a diluted $F_2$ gas, said process gas exerting, in the state of plasma, the effects of etching said film and depositing reaction products on the wall surface of an opening formed by etching, while generating, in the state of non-plasma and with activation energy lower than a specified level, a volatile material from a deposition species generated in said etching so as to contribute to the suppression of film formation; and removing at least a part of said film by turning the process gas into a plasma in the vicinity of the semiconductor substrate in said reaction chamber.

* * * * *

UNITED STATES PATENT AND TRADEMARK OFFICE
CERTIFICATE OF CORRECTION

PATENT NO. : 5,716,494
DATED : February 10, 1998
INVENTOR(S) : SHINICHI et al.

It is certified that error appears in the above-identified patent and that said Letters Patent is hereby corrected as shown below:

Title page, under "Foreign Application Priority Data":
Insert --June 22, 1992, Japan, 4-161551--

Signed and Sealed this

Twenty-fourth Day of November, 1998

Attest:

BRUCE LEHMAN

Attesting Officer

Commissioner of Patents and Trademarks